US006408155B1

(12) United States Patent
Tajima et al.

(10) Patent No.: US 6,408,155 B1
(45) Date of Patent: Jun. 18, 2002

(54) COLOR PRINTING DEVICE

(75) Inventors: Noriyuki Tajima, Osaka; Noboru Katakabe, Kyoto, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/678,264

(22) Filed: Oct. 3, 2000

(30) Foreign Application Priority Data

Oct. 8, 1999 (JP) .......................................... 11-287847
Oct. 8, 1999 (JP) .......................................... 11-287848

(51) Int. Cl.[7] .......................... F03G 15/01; G03F 15/16
(52) U.S. Cl. ....................................... 399/298; 399/302
(58) Field of Search .......................... 399/66, 223, 228, 399/239, 298, 302, 303; 347/115, 117, 118

(56) References Cited

U.S. PATENT DOCUMENTS 4,939,547 A * 7/1990 Miyaji et al. ............... 399/228
5,610,701 A 3/1997 Terada et al.
5,809,380 A 9/1998 Katakabe et al.
5,956,552 A 9/1999 Katakabe et al.

FOREIGN PATENT DOCUMENTS

| | | | |
|---|---|---|---|
| JP | 63-109462 | * | 5/1988 |
| JP | 5-204224 | * | 8/1993 |
| JP | 5-216312 | * | 8/1993 |
| JP | 7-36246 | | 2/1995 |
| JP | 9-304996 | | 11/1997 |
| JP | 11-295953 | | 10/1999 |
| WO | 98/13732 | | 4/1998 |

* cited by examiner

*Primary Examiner*—Joan Pendegrass
(74) *Attorney, Agent, or Firm*—Merchant & Gould PC

(57) ABSTRACT

A color image forming apparatus capable of reducing the total printing time and having an excellent cost performance. In the four developments and primary transfer by the toner of yellow, magenta, cyan, and black for forming one sheet of color image, the development and primary transfer of the toner of the last color, black, is performed at a different speed from that of the toner of the other colors. Furthermore, the secondary transfer and fixation are performed at the same speed as of the development and primary transfer of the toner of the last color, black.

17 Claims, 21 Drawing Sheets

The speed of the development and the primary transfer by each toner of Y,M and C : 150mm/sec , 377/150=2.51sec= $t_y, t_m, t_c$ The speed of the development and the primary transfer by the toner of Bk : 100mm/sec , 377/100=3.77sec= $t_{bk}$ The speed of the development and
the primary transfer by each toner of Y,M and C : 150mm/sec , 377/150=2.51sec= $t_y$, $t_m$, $t_c$ The speed of the development and
the primary transfer by the toner of Bk : 100mm/sec , 377/100=3.77sec= $t_{bk}$

COLOR PRINTING DEVICE

FIELD OF THE INVENTION

The present invention relates to a color image forming apparatus that is useful, for example, as a color printer, a color copying machine, a color facsimile, and the like, and in particular, to a color image forming apparatus capable of forming a color image by overlapping toner images of many colors by using electrophotography.

BACKGROUND OF THE INVENTION

As a conventional color image forming apparatus, for example, one disclosed in JP 9-304996A is well known.

The following is a description of a conventional color image forming apparatus, with reference to FIGS. 19 and 20. FIG. 19 is a cross-sectional view showing an overall structure of a conventional color image forming apparatus; and FIG. 20 is a time chart showing an image forming operation of the conventional color image forming apparatus.

As shown in FIG. 19, an intermediate transfer belt unit 201 includes an intermediate transfer belt 202, a primary transfer roller 203, a secondary transfer roller 204, a cleaner roller 205, a waste toner reservoir 206, and the like, and toner image of each color can be overlapped on the intermediate transfer belt 202. In the center part of this color image forming apparatus, a group of developing units 208 are provided. Four developing units 207Y, 207M, 207C and 207Bk for yellow, magenta, cyan and black, each unit being of sector shape in cross section, are arranged circularly to form the group of developing units 208. These developing units 207Y, 207M, 207C and 207Bk are installed properly in the color image forming apparatus. The mechanical driving systems and electrical circuit systems are coupled between the developing units 207Y, 207M, 207C and 207Bk and other portions of the color image forming apparatus via mutual coupling members, so that both sides are mechanically and electrically connected. The developing units 207Y, 207M, 207C and 207Bk are supported by a supporting member and collectively rotated by a driving motor, so that they can rotate around a non-rotatable cylindrical drum 209. Furthermore, at the time of image formation, the developing units 207Y, 207M, 207C and 207Bk are moved successively by rotation to an image forming position 210, which opposes the primary transfer roller 203 that supports the intermediate transfer belt 202. The image forming position 210 is also an exposure position for exposing a photosensitive member 218 with a laser signal beam 211.

Inside this color image forming apparatus, a laser exposure device 212 is arranged horizontally below the group of developing units 208. The laser signal beam 211 passes through an optical path 213 provided between the developing unit 207M for magenta and the developing unit 207C for cyan, and through an opening provided in a part of the cylindrical drum 209, and is incident onto a mirror 214, which is arranged inside the cylindrical drum 209 and fixed to the apparatus main body.

In the standing state, usually, the developing unit 207Bk for black is located at the image forming position 210. Therefore, first, the group of developing units 208 is rotated 90° so as to move the developing unit 207Y for yellow to the image forming position 210. The laser signal beam 211, which is incident onto the mirror 214, is reflected from the mirror 214 and enters the developing unit 207Y for yellow, which is positioned at the image forming position 210, by way of an exposure window 215 of the developing unit 207Y for yellow. In this case, the laser signal beam 211 passes through an optical path between a developing device 216 and a cleaner 217, arranged on the upper and lower sides in the developing unit 207Y, is incident into an exposure portion on the left side face of the photosensitive member 218, so as to scan the photosensitive member 218 in the direction of the main line. Thereby, the photosensitive member 218 is exposed, so that an electrostatic latent image is formed. Then, the electrostatic latent image is developed by the developing device 216, and thus a toner image is formed on the surface of the photosensitive member 218.

The toner image formed on the photosensitive member 218 is transferred onto the intermediate transfer belt 202. Then, the group of developing units 208 is rotated 90°, so that the developing unit 207M for magenta moves into the image forming position 210. An operation similar to the above-mentioned formation of the yellow toner image is performed and a magenta toner image is overlapped on the yellow toner image previously formed on the intermediate transfer belt 202. Similar operations as mentioned above are performed using developing units 207C for cyan and 207Bk for black to compose a full color image on the intermediate transfer belt 202. The transfer in which the toner image of each color is transferred onto the intermediate transfer belt 202 is referred to as "primary transfer."

When the top of the image on the intermediate transfer belt 202 on which the last black toner image is transferred reaches a secondary transfer position, a tertiary transfer roller 219 pushes the recording paper onto the intermediate transfer belt 202. Thus, the secondary transfer of the toner image to the recording paper starts. The toner images of four colors are transferred onto the recording paper together. At the time the secondary transfer starts, the image forming process on the photosensitive member 218 is continued. The primary transfer from the photosensitive member 218 to the intermediate transfer belt 202 and the secondary transfer from the intermediate transfer belt 202 to the recording paper simultaneously proceed.

When the primary transfer of the black toner image from the photosensitive member 218 onto the intermediate transfer belt 202 is completed, the top of the toner images of four colors, which is transferred onto the recording paper, starts to pass through a fixing device 220. Thereby, the recording paper on which toner images of four colors are transferred is fixed and ejected out of the apparatus. Even if the primary transfer of the black toner image from the photosensitive member 218 to the intermediate transfer belt 202 is completed, the secondary transfer from the intermediate transfer belt 202 to the recording paper is continued. Therefore, the photosensitive member 218 and the intermediate transfer belt 202 continue to be rotated. At this time, the photosensitive member 218 is not irradiated with the laser signal beam 211 and the photosensitive member 218 and the developing device are in a so-called idling state.

When the intermediate transfer belt 202 makes 4.5 rotations in total, the secondary transfer of the toner image from the intermediate transfer belt 202 onto the recording paper is completed and the photosensitive member 218 and the intermediate transfer belt 202 stop.

Thereafter, the group of developing units 208 is rotated 90°, so that the image formation starts sequentially from the yellow again.

By repeating the above-mentioned operations, a plurality of color images are output successively.

Any toner remaining on the intermediate transfer belt 202 is scraped off by the cleaner roller 205 that is in contact with the intermediate transfer belt 202. The scraped-off toner is collected in the waste toner case 206.

In general, in the conventional color image forming apparatus, as shown in FIG. 20, the developing speed and the primary transfer speed were the same in four colors. Also, the developing speed and the primary transfer speed were the same as the secondary transfer speed and the fixing speed.

Therefore, for example, when the time required for the operation of switching the developing unit 207 by rotating 90° the carriage 2 and coupling of the photosensitive member 218, etc., is 1.0 second, the developing speed by each toner-of yellow (Y), magenta (M), cyan (C) and black (Bk) and the primary transfer speed is 100 mm/second, and the peripheral length of the intermediate transfer belt 202 is 377 mm, the time for outputting one sheet of color image is expressed by:

$$T'=1.0\times4+(377/100)\times4.5=21 \text{ seconds.}$$

In order to optimize the cost performance of the apparatus, it is desirable to match each performance (=speed) in development, primary transfer, secondary transfer and fixation. However, there are limitations in making serialization of products or sharing units-parts, and the like, it is rare in fact that each performance is accorded to each other. As a result, for example, although there is a sufficient performance for development and primary transfer, the whole speed of the image formation is determined by the performance in the secondary transfer and fixation.

Furthermore, with respect to the black toner, as compared with toners of other colors, i.e., yellow, magenta, and cyan, there is no limitation in the coloring when the colors are overlapped or the permeability in OHP printing. Therefore, in general, it is relatively easy for the black toner to enhance the developing performance as compared with the color toners. However, in the conventional color image forming apparatus, since the developing speeds of four colors were set to be the same, the characteristics of the black toner are not utilized effectively.

Furthermore, another conventional color image forming apparatus is disclosed in, for example, JP 7-36246A. The structure of this image forming apparatus is similar to that of the above-mentioned apparatus disclosed in JP 9-304996A (see FIG. 19). In this case, the formation of the toner images and the transfer operation onto the intermediate transfer belt 202 are performed in the order of black(Bk)—yellow(Y)—magenta(M)—cyan(C). When a full color image is completed on the intermediate transfer belt 202, a recording paper is conveyed by a second transfer roller 204 and a third transfer roller 219, and at the same time, the full color image is transferred onto the recording paper. The recording paper onto which the full color image is transferred is conveyed to the fixing device 220, and thereby the full color image is fixed to the recording paper, and then the recording paper is ejected out of the apparatus.

When the formation of one sheet of color image is completed, the group of developing units 208 is further rotated 90°. Then, the developing unit 207Bk for black returns to the image forming position 210, thus completing the preparations for the next color image forming operation.

As mentioned above, in the conventional image forming apparatus having the rotating developing units, when one sheet of color image is formed, the switching operation of the developing unit is performed four times and a predetermined time is required for each switching operation of the developing units. In other words, before the next color starts to be exposed, it is necessary to have switching time including a time for rotating 90° the group of developing units, a time required for releasing and coupling the driving coupling of the photosensitive member located at the image forming position and the apparatus main body side, a time when the photosensitive member is driven to be rotated and then the rotation speed becomes stable, a time for charging the rotating photosensitive member to a certain level, and the like.

Such a switching time is not short for an outputting speed per sheet in successively outputting a plurality of color images, thus causing a problem in realizing a high speed color image forming apparatus.

In order to solve this problem, for example, WO98/13732 proposes a color image forming apparatus having a high speed mode as shown in FIG. 21(*b*). Namely, in the high speed mode, as shown in FIG. 21(*b*), the order of overlapping the toner images of many colors onto the intermediate transfer belt is not the same every time. The first sheet begins with black (Bk) and ends in cyan (C);, the second sheet begins with cyan (C) and ends in magenta (M); and the third sheet begins with magenta (M) and ends in yellow (Y). In other words, in the normal mode, as shown in FIG. 21(*a*), the carriage is rotated 90° so as to move the developing unit for yellow (Y) to the image forming position every time. However, in the high speed mode, this operation is not performed, the first toner image is transferred by the use of the developing unit of the last color used in the previous image formation.

However, in the color image forming apparatus having the above-mentioned high speed mode, since the order of overlapping the toner images of yellow (Y), magenta (M) and cyan (C) is changed in each recording paper, there is a problem in that colors are misaligned.

SUMMARY OF THE INVENTION

It is an object of the present invention to provide an image forming apparatus capable of reducing the total printing time and having an excellent cost performance. Furthermore, it is another object of the present invention to provide an image forming apparatus capable of outputting a plurality of color images successively at high speed and preventing the color misalignment.

In order to achieve the above-mentioned objects, a first configuration of a color image forming apparatus according to the present invention includes a photosensitive member on the surface of which an electrostatic latent image is formed, a plurality of developing units each having a different color of toner and developing means, a developing unit moving means for switching the plurality of developing units by moving them selectively between an image forming position and other positions, a primary transfer means for overlapping sequentially toner images of many colors, which are formed on the photosensitive member by the plurality of developing units, thereby transferring a color image onto an intermediate transfer member, an intermediate transfer member driving means for driving the intermediate transfer member at a predetermined speed, a secondary transfer means for transferring the color image, which is primary transferred by being overlapped on the intermediate transfer member, onto a printing medium, and a fixing means for fixing the color image, which is transferred on the printing medium, to the printing medium, wherein, in several times of primary transfers by toners of a plurality of colors for forming one sheet of color image, the primary transfer by the toner of the last color is performed at a different speed from that of the toners of the other colors.

According to the first configuration of the color image forming apparatus, it is possible to set the performance in the secondary transfer and fixation and the performance in the development and primary transfer separately by differentiating the speed of the developing onto the photosensitive member and the primary transfer onto the intermediate transfer member by the toner of the color other than the last color from the speed of the secondary transfer onto the printing medium and the fixation when the development to the photosensitive member and primary transfer onto the intermediate transfer member by the toner of the last color and the secondary transfer onto the printing medium and fixation are performed simultaneously. As a result, it is possible to optimize the cost performance in the secondary transfer means and fixing means. Therefore, for example, it is not necessary to introduce a large and expensive transfer device and fixing device for the purpose of matching the secondary transfer speed and fixing speed to the high-performance developing speed and primary transfer speed.

Furthermore, in a case where the performance in the secondary transfer and fixation is higher than the performance in the development and primary transfer, by enhancing the performance in the development and primary transfer by black toner and by using the black toner as a last color, it is possible to reduce the total printing time. Since the black toner has no limitation in permeability as compared with the toners of the other colors, there are many choices in base materials and additives and it is relatively easy to enhance the performance in the development and primary transfer.

Furthermore, it is preferable in the first configuration of the color image forming apparatus according to the present invention that the following expression is satisfied:

$$L1<Lp, L2<Lp,$$

wherein L1 denotes a distance between a primary transfer position in which the primary transfer is performed onto the intermediate transfer member by the primary transfer means and a secondary transfer position in which a secondary transfer is performed onto the printing medium by the secondary transfer means, L2 denotes a distance between the secondary transfer position and a fixing position in which fixation is performed on the printing medium by the fixing means, and Lp denotes a length of the printing medium in a conveying direction. According to such a preferable configuration, it is possible to make the whole apparatus compact. In this case, in order to minimize the total color printing time, it is essential to perform the development and primary transfer of the last color simultaneously with the secondary transfer. In the apparatus having such a configuration, by applying the first configuration of the color image forming apparatus according to the present invention, the same effect can be obtained as in the first configuration. Thus, it is possible to utilize the performance of the apparatus most effectively.

Furthermore, it is preferable in the first configuration of the color image forming apparatus according to the present invention that the number of developing units is four, colors of the toner included in the four developing units are yellow, magenta, cyan and black, respectively, and the last color in the primary transfer is yellow or black. According to such a preferable configuration, even if the color misalignment occurs due to the difference in the image forming speed, it is less remarkable than that of the toner of magenta and cyan.

Furthermore, it is preferable in the first configuration of the color image forming apparatus according to the present invention that each of the plurality of developing units is formed integrally as one unit including the photosensitive member. According to such a preferable configuration, since the photosensitive member and toner, both of which are consumables, are integrated into one developing unit, it is possible to minimize the frequency of exchanging consumables, thus to improve the operation efficiently in exchanging consumables.

Furthermore, a second configuration of a color image forming apparatus according to the present invention includes a photosensitive member on the surface of which an electrostatic latent image is formed, a plurality of developing units each having a different color of toner and developing means, a developing unit moving means for switching the plurality of developing units by moving them selectively between an image forming position and other positions, a transfer drum around which a printing medium can be wound and for overlapping sequentially toner images of many colors, which are formed on the photosensitive member, thereby transferring a color image onto the printing medium, and a fixing means for fixing the color image, which is transferred onto the printing medium, to the printing medium, wherein, in several times of transfers by toners of a plurality of colors for forming one sheet of color image, the transfer by the toner of the last color is performed at a different speed from that by the toners of the other colors.

According to the second configuration of the color image forming apparatus, it is also possible to obtain the same effect as in the first configuration of the color image forming apparatus according to the present invention.

Furthermore, it is preferable in the second configuration of the color image forming apparatus according to the present invention that the following expression is satisfied:

$$L3<Lp,$$

wherein L3 denotes a distance between a transfer position in which the color image is transferred onto the printing medium and a fixing position in which a fixation is performed to the printing medium by the fixing means, and Lp denotes a length of the printing medium in a conveying direction.

Furthermore, it is preferable in the second configuration of the color image forming apparatus according to the present invention that the number of developing units is four, colors of the toner included in the four developing units are yellow, magenta, cyan and black, respectively, and the last color transferred onto the printing medium is yellow or black.

Furthermore, a third configuration of a color image forming apparatus according to the present invention includes a plurality of developing units each having a different color of toner and developing means, a developing unit moving means for switching the plurality of developing units by moving them selectively between an image forming position and other positions, a photosensitive member capable of receiving a color image formed overlapping sequentially toner images of many colors obtained by the plurality of developing units, a transfer means for transferring the color image formed on the photosensitive member onto a printing medium, and a fixing means for fixing the color images, which is transferred onto the printing medium, to the printing medium, wherein, in the several times of development by toners of a plurality of colors for forming one sheet of color image, the development by the toner of the last color is performed at a different speed from that of the toners of the other colors.

According to the third configuration of the color image forming apparatus, it is also possible to obtain the same effect as in the first configuration of the color image forming apparatus according to the present invention.

Furthermore, it is preferable in the third configuration of the color image forming apparatus according to the present invention that the following expression is satisfied:

$L4<Lp, L5<Lp,$ wherein L4 denotes a distance between a developing position in which the development is performed onto the photosensitive member by the developing unit and a transfer position in which the transfer is performed onto the printing medium by the transfer means, L5 denotes a distance between the transfer position and a fixing position in which the fixation is performed on the printing medium by the fixing means, and Lp denotes a length of the printing medium in a conveying direction.

Furthermore, it is preferable in the third configuration of the color image forming apparatus according to the present invention that the number of developing units is four, colors of the toner included in the four developing units are yellow, magenta, cyan and black, respectively, and the last color in the development onto the photosensitive member by the developing is yellow or black.

Furthermore, a fourth configuration of a color image forming apparatus according to the present invention includes a photosensitive member on the surface of which an electrostatic latent image is formed, a plurality of developing units each having a different color of toner and developing means, a developing unit moving means for switching the plurality of developing units by moving them selectively between an image forming position and other positions, a transfer means for forming one sheet of color image on a transfer member by bringing the transfer member into contact with the photosensitive member, by sequentially transferring a toner image formed on the photosensitive member, and by overlapping the toner images of each color, in accordance with the switching of the developing units positioned at the image forming position, and a transfer member driving means for driving the transfer member, with at least one of the plurality of developing units having a black toner; wherein the apparatus has a high speed mode for outputting a plurality of color images, wherein when a first sheet of color image is formed, a black toner image is finally overlapped to form one sheet of color image; when a second sheet of color image is formed following the formation of the first sheet of color image, the developing unit moving means is not operated and the image formation continuous with the developing unit for black remaining at the image forming position, thus forming one sheet of color image by first transferring the black toner image onto the transfer member; and when a third sheet of color image is formed following the formation of the second sheet of color image, one sheet of color image is formed in the same order of overlapping the toner images of many colors as that of the first sheet of color image.

According to the fourth configuration of the color image forming apparatus, since a plurality of color images are output successively in high speed mode, it is possible to reduce the printing speed as compared with the case of outputting the plurality of color images successively by overlapping the images of all colors in the same order every time in the normal mode.

Furthermore, in the high speed mode, the order of overlapping the toner images in the first sheet (or third sheet) of color image and the second sheet of color image are different only in that the black toner image is transferred first or overlapped at the end and the order of overlapping the toner images of yellow, magenta and cyan is the same. Therefore, no color misalignment occurs. Moreover, when this configuration is employed, it is possible remarkably to reduce the printing time of the color image forming apparatus having a process in which the transfer member stops every time one color toner image is transferred onto the transfer member and the developing units are switched during a standing state of the transfer member. Moreover, this configuration is also effective in the color image forming apparatus having a process of reducing the driving speed of the transfer member when the developing units are switched. Furthermore, this configuration is also effective in the color image forming apparatus in which the transfer member does not stop temporarily when the developing units are switched and the driving speed of the transfer member is constant, because it is possible to shorten the idle running distance between the first sheet of color image and the second sheet of color image, and thus it is possible to reduce the total printing time when a plurality of sheets are printed. Namely, it is possible to reduce a so-called "paper-to-paper distance".

Furthermore, it is preferable in the fourth configuration of the color image forming apparatus according to the present invention that the transfer member is an intermediate transfer member for re-transferring one sheet of color image formed by the toner images of many colors onto the recording paper together. According to such a preferable configuration, as compared with the color image forming apparatus without using the intermediate transfer member, that is, the apparatus having a process in which the toner image of each color is overlapped onto the recording paper wound around the transfer drum, it is possible to reduce the inertial property of the transfer member. Therefore, it is possible to shorten the time required for stopping the transfer member between the transfer of toner images of each color and re-operating the transfer member, and to reduce the power required for the transfer member driving means.

Furthermore, it is preferable in the fourth configuration of the color image forming apparatus according to the present invention that each of the plurality of developing units is formed integrally as one unit including the photosensitive member.

Furthermore, it is preferable in the fourth configuration of the color image forming apparatus according to the present invention that the apparatus further includes a normal mode for outputting a plurality of color image, wherein when a first sheet of color image is formed, a black toner image is finally overlapped to form one sheet of color image; and when a second sheet of color image is formed following the formation of the first sheet of color image, one sheet of color image is formed in the same order of overlapping the toner images of many colors as that of the first sheet of color image by switching the developing units.

Furthermore, it is preferable in the fourth configuration of the color image forming apparatus according to the present invention that the apparatus further includes a four-color mode for forming the color image by using four colors of yellow, magenta, cyan and black; and three-color mode for forming the color image by using three colors of yellow, magenta and cyan.

Furthermore, it is preferable in the fourth configuration of the color image forming apparatus according to the present invention that the developing unit for black is positioned at the image forming position during a standing state in which the printing is not performed. Generally, the apparatus takes a standing state with the developing unit located at the image forming position remaining when the printing is completed. According to such a preferable configuration, it is possible to reduce the printing time of the first sheet in printing a monochromatic image, which is used frequently. Furthermore, when the color image is printed, it is possible to start to print usually in the same sequence. Furthermore, the printing time of the first sheet is not changed depending upon the state in which the previous printing is completed.

Furthermore, it is preferable in the fourth configuration of the color image forming apparatus according to the present invention that when the developing units are switched by operating the developing unit moving means for forming the third color image after the second color image is formed, the developing unit for the first color on which the first color image is formed is moved to the image forming position without stopping the developing unit moving means midway. For example, in forming three color images in the order of Y (yellow)—M (magenta)—C (cyan)—Bk (black), Bk—Y—M—C, and Y—M—C—Bk, after the second sheet of color image is formed, by the use of the developing unit moving means, the developing units are switched in the order of C—Bk—Y. Therefore, it is possible to further reduce the printing time by moving the developing unit for yellow to the image forming position without temporarily stopping the developing unit for black at the image forming position.

DETAILED DESCRIPTION OF THE INVENTION

Hereinafter, the present invention will be described by way of embodiments with reference to drawings.

First Embodiment

Figure 1:
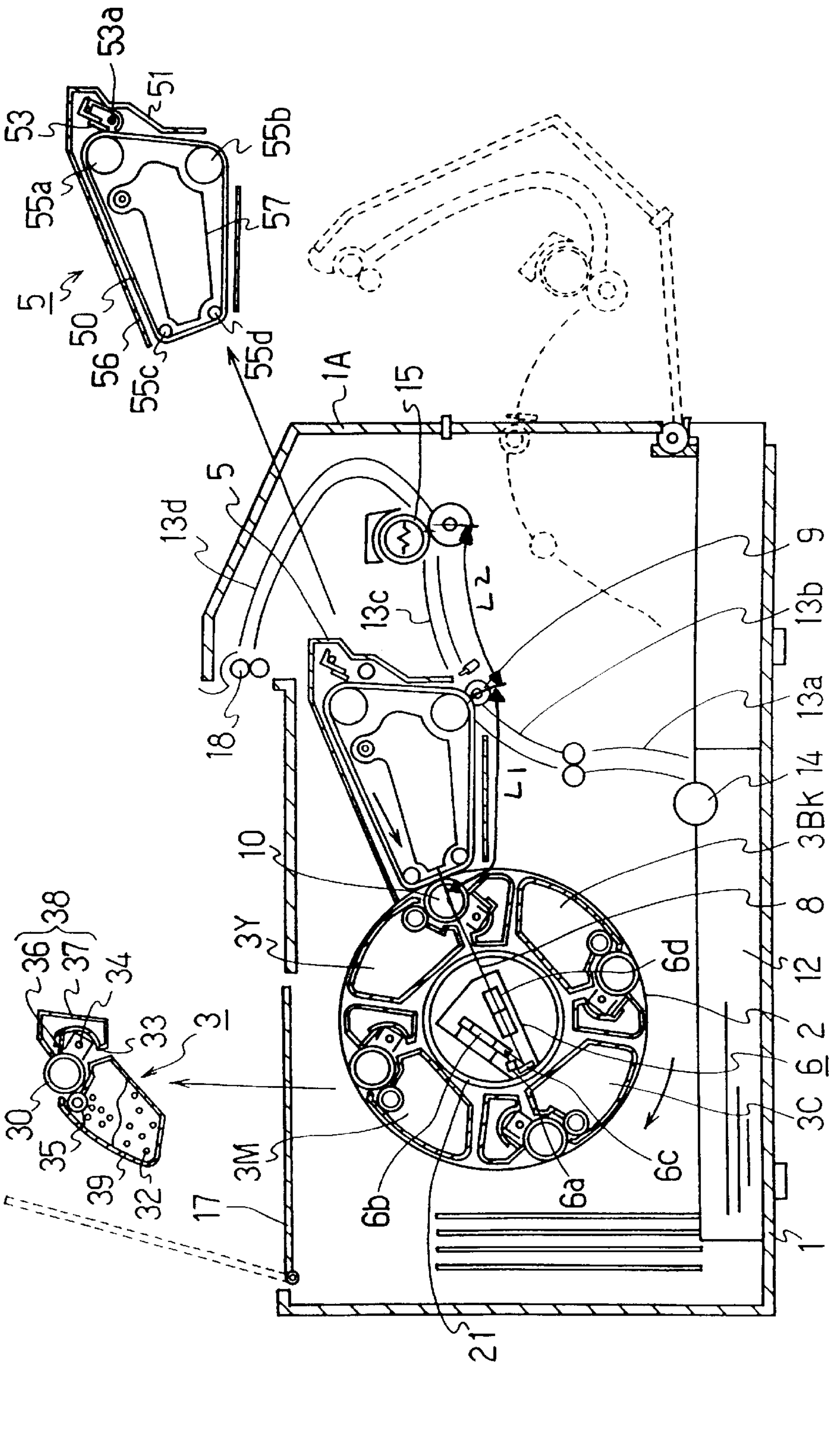
FIG. 1 is a cross-sectional view showing an overall configuration of a color image forming apparatus in a first embodiment according to the present invention.
Figure 2:
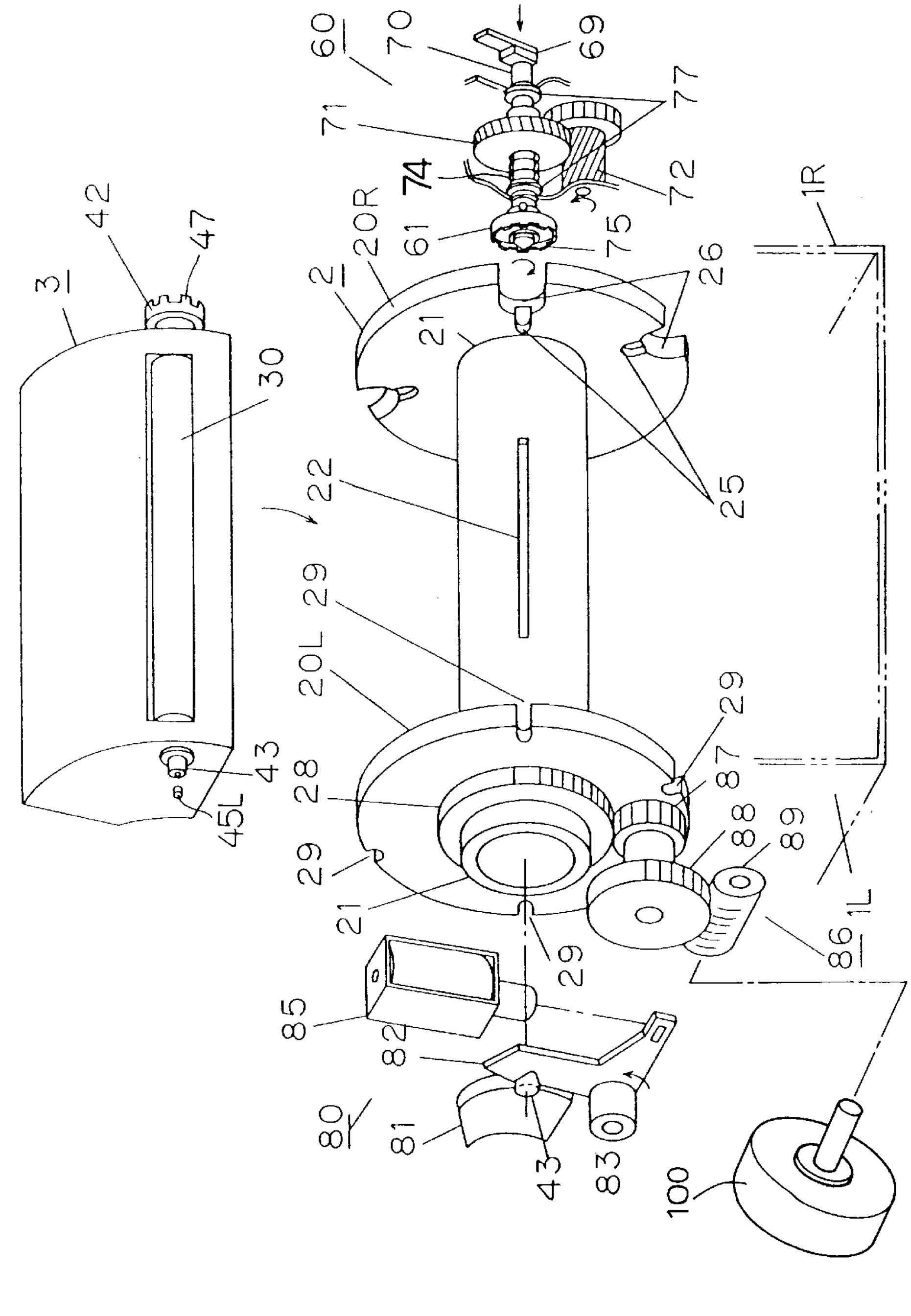
FIG. 2 is an exploded perspective view showing a positioning mechanism of a carriage and a photosensitive member and a driving mechanism in the first embodiment according to the present invention.
Figure 3:
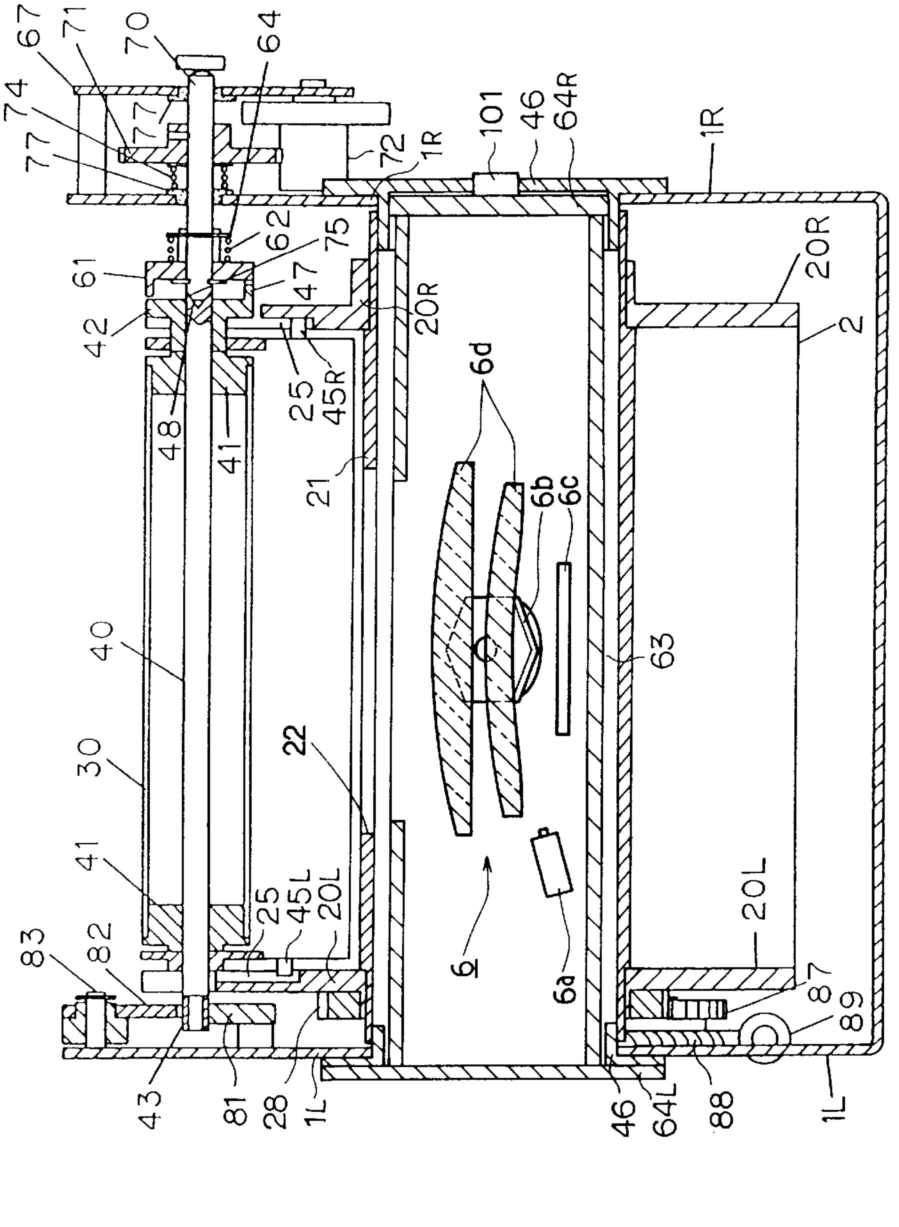
FIG. 3 is a cross-sectional view showing a carriage including a photosensitive member axis of a developing unit located at an image forming position of the color image forming apparatus in the first embodiment according to the present invention.
Figure 4:
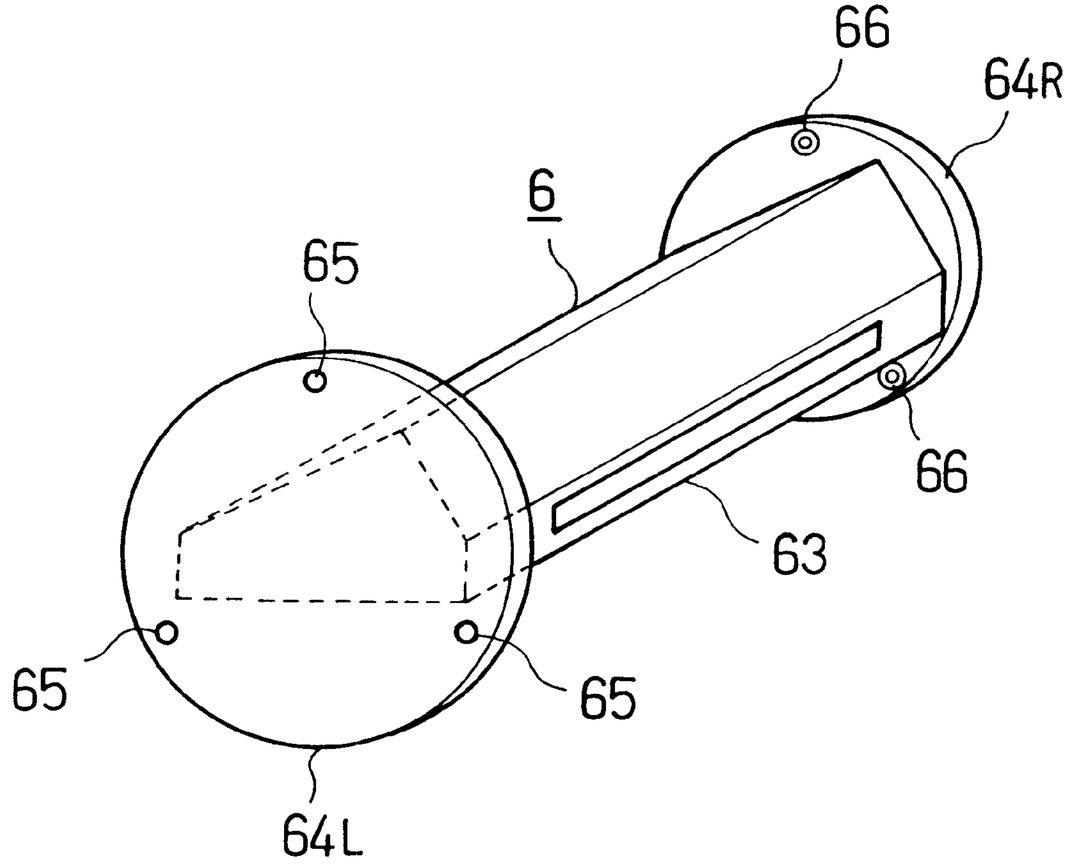
FIG. 4 is a perspective view showing an appearance of a laser exposure device of the color image forming apparatus in the first embodiment according to the present invention.
Figure 5:
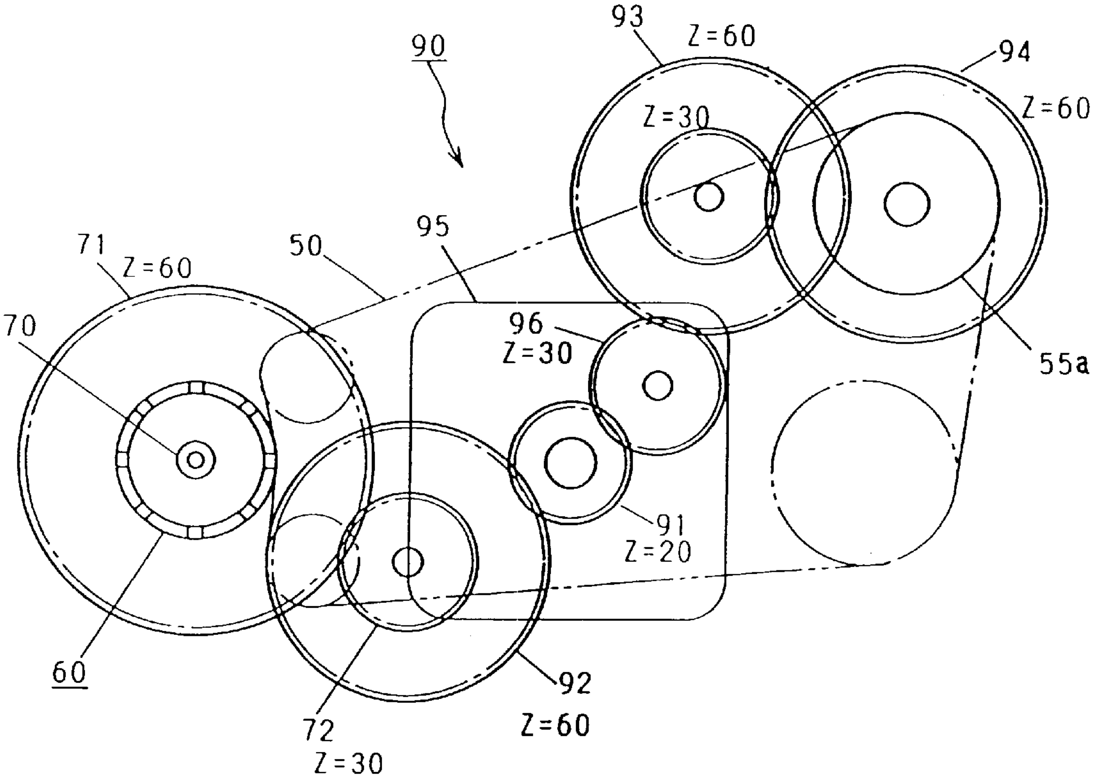
FIG. 5 is a view showing a transmission system of a driving mechanism at an apparatus main body side, which drives a photosensitive member and an intermediate transfer belt of the color image forming apparatus in the first embodiment according to the present invention.
Figure 6:
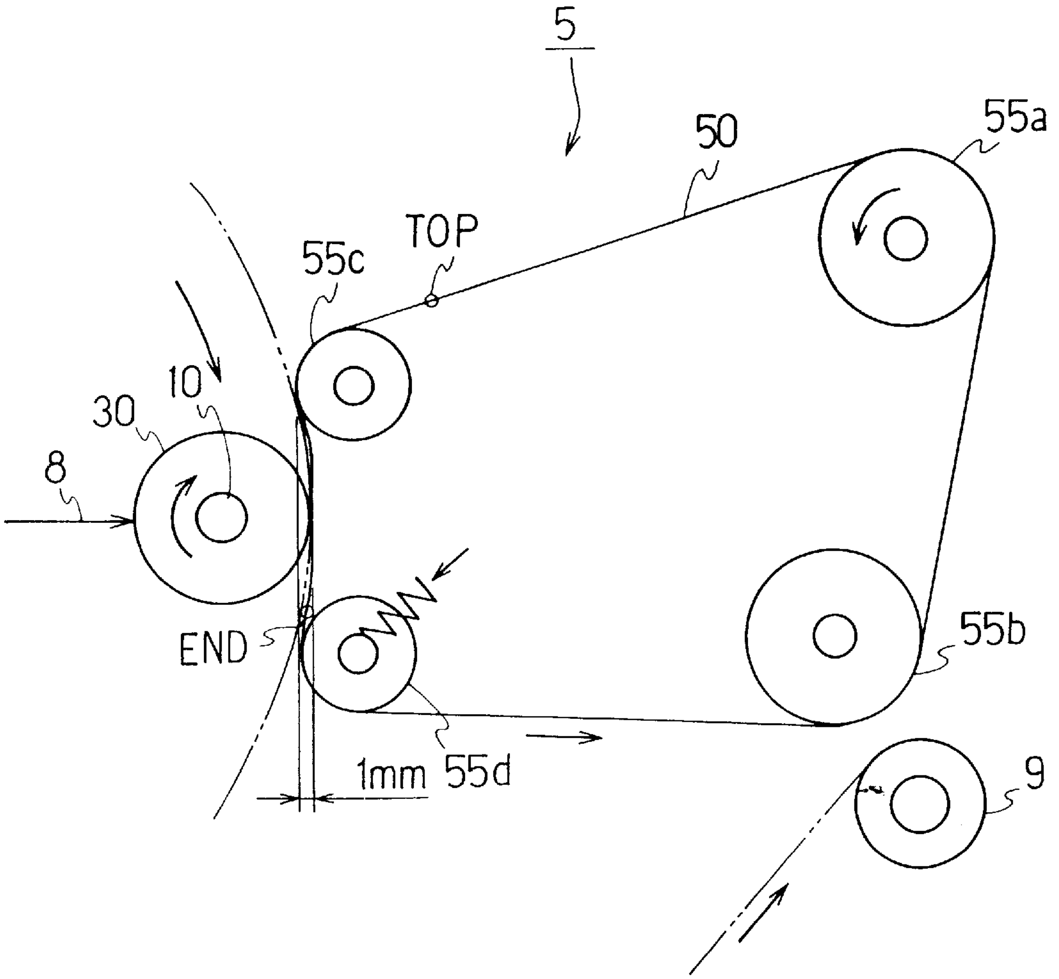
FIG. 6 is a view showing the location relationship between the photosensitive member of a developing unit and an intermediate transfer belt of the color image forming apparatus in the first embodiment according to the present invention.

FIG. 1 is a cross-sectional view showing an overall configuration of a color image forming apparatus in a first embodiment according to the present invention; FIG. 2 is an exploded perspective view showing a positioning mechanism of a carriage and a photosensitive member and a driving mechanism in the first embodiment according to the present invention; FIG. 3 is a cross-sectional view showing a carriage including a photosensitive member axis of a developing unit located at an image forming position of the color image forming apparatus in the first embodiment according to the present invention; FIG. 4 is a perspective view showing an appearance of a laser exposure device of the color image forming apparatus in the first embodiment according to the present invention; FIG.5 is a view showing a transmission system of a driving mechanism at an apparatus main body side, which drives a photosensitive member and an intermediate transfer belt of the color image forming apparatus in the first embodiment according to the present invention; and FIG. 6 is a view showing the location relationship between the photosensitive member of a developing unit and an intermediate transfer belt of the color image forming apparatus in the first embodiment according to the present.

In FIG. 1, the right-hand face is the front face of the apparatus. The apparatus main body 1 includes a carriage 2 at approximately the center thereof, a front alligator 1A on the front face and a top door 17 on a top face.

The front alligator 1A is hinged to the apparatus main body 1 with a hinge axis, and can be lowered and opened toward the front. The front alligator 1A is provided with a front side of the paper guide 13*a*, 13*b*, 13*c* and 13*d* for guiding a recording paper fed by a paper feed roller 14 from a paper feed unit 12, a fixing device 15 for fixing a color image secondary-transferred onto the recording paper from an intermediate transfer belt 50 and paper eject rollers 18. When the front alligator 1A is lowered toward the front, these components also are lowered toward the front together. Therefore, it is possible to open the front face of the apparatus main body 1 widely and to attach/detach a transfer belt unit 5 into/from this opened part. At the same time, it is possible to remove the recording paper easily at the time of paper jamming.

Developing Unit

In FIG. 1, numeral 3 denotes a developing unit for each color (yellow, magenta, cyan and black), which is formed integrally as one unit including a photosensitive member 30 and the process elements provided therearound. Each element includes the following parts.

Numeral 34 denotes a corona charger for homogeneously charging the photosensitive member 30 negatively, and 35 denotes a developing device including a developing roller. Numeral 39 denotes a toner hopper containing toner 32. The toner 32 is made of polyester resin in which a pigment is dispersed and charged negatively. The toner 32 is supported on the surface of the developing roller of the developing device 35 and develops the photosensitive member 30. Numeral 38 denotes a cleaner for cleaning off the toner remaining on the surface of the photosensitive member 30 after transfer, which includes a rubber cleaning blade 36 and a waste toner case 37 for holding waste toner. Numeral 33 denotes an optical path by which a laser beam 8 can enter the developing unit 3. The diameter of the photosensitive member 30 is about 30 mm, and the diameter of the developing roller of the developing device 35 is about 16 mm. They are rotatably supported by the side walls of the developing unit 3, respectively.

Transfer Belt Unit

A transfer belt unit 5 receives a toner image formed on the photosensitive member 30 of the developing unit 3 at the image forming position 10 and transfers again the received toner image onto the recording paper. The transfer belt unit 5 includes an intermediate transfer belt 50, a group of pulleys 55*a*–55*d* for suspending the intermediate transfer belt 50, a cleaner 51 and a waste toner case 57 for holding the waste toner after cleaning. These members are formed into one unit, and the unit is attached to the apparatus main body 1 detachably. The cleaner 51 cleans off the toner remaining on the intermediate transfer belt 50. This cleaner 51 includes a cleaning blade 53 made of rubber, and a screw 53a for carrying scraped toner into the waste toner case 57.

The intermediate transfer belt 50 is an endless belt having a thickness of about 150 μm, and is made of a film of semiconductive (middle resistivity) polycarbonate. The peripheral length of the intermediate transfer belt 50 is set to be 377 mm, which corresponds to the total length of the maximum length (297 mm) of A4 size and the length a little bit longer than half of the peripheral length of the photosensitive member 30 (diameter: about 30 mm) so that A4 size or letter size recording paper can be used for full color printing.

Among the group of pulleys 55*a*–55*d* suspending the intermediate transfer belt 50, the guide pulley 55*a* is a driving pulley for driving the intermediate transfer belt 50, which also has a function of backing up the cleaning blade 53. The guide pulley 55*b* is a back-up roller backing up a secondary transfer roller 9 that transfers a toner image on the intermediate transfer belt 50 onto the recording paper. The guide pulley 55*c* is a guide roller that also functions as a roller for applying a primary transfer bias for transferring the toner image onto the intermediate transfer belt 50 from the photosensitive member 30. The guide pulley 55*d* is a tension roller providing the intermediate transfer belt 50 with a tension. These guide pulleys 55*a*–55*d* suspend the intermediate transfer belt 50. The intermediate transfer belt 50 can be rotated by the rotation of the driving pulley 55*a*. Numeral 56 denotes a cover for protecting the intermediate transfer belt 50.

A transfer belt unit 5 is positioned reliably at a predetermined position when it is attached to the apparatus main body 1, and the portion facing the image forming position 10 is in contact with the photosensitive member 30 of the developing unit 3. Furthermore, at the same time, each portion of the transfer belt unit 5 is connected electrically to the side of the apparatus main body and the driving pulley 55*a* is connected to the driving means at the side of the apparatus main body. Thereby, intermediate transfer belt 50 can be rotated.

Carriage

A carriage 2 contains four developing units 3Y, 3M, 3C and 3Bk for four colors (yellow, magenta, cyan, and black). The carriage 2 is supported on a cylinder drum 21 rotatably, thereby switching the photosensitive member 30 of the developing unit 3 by sequentially shifting the photosensitive member 30 of the developing unit 3 for each color between the image forming position 10 and the other waiting positions.

The developing unit 3 is attached to the apparatus main body 1 detachably. When one of the developing units 3 need to be replaced with a new unit, it can be done after rotating the carriage 2 so that the developing unit 3 of the color to be replaced is located underneath the top door 17, and opening the top door 17.

Inside the carriage 2, the developing unit 3 can form images only at an image forming position 10 where the photosensitive member 30 is irradiated with the laser beam 8 and the transfer belt unit 5 is in contact with the photosensitive member 30. The developing unit 3 is connected to a driving source or a power source of the apparatus main body 1 at the image forming position 10, thereby performing the image forming operation. The other positions are waiting positions in which the developing units 3 are not operated.

As shown in FIGS. 1–3, the carriage 2 has a right wall 20R and a left wall 20L, which are fixed to the cylindrical drum 21 provided in the center of the carriage 2. The cylindrical drum 21 has a total of four exposure windows 22 at positions corresponding to the positions where the laser beam 8 for exposing the photosensitive member passes through.

Furthermore, the peripheral portion of the right side wall 20R is provided with a right notch 26 receiving a coupling plate 42 fixed to the photosensitive member 30 of the developing unit 3. When properly positioned, the gap is provided between the right notch 26 and the coupling plate 42 so that the coupling plate 42 is not brought into contact with the right side wall 20R. The peripheral portion of the left side wall 20L is provided with a left notch 29 receiving a collar 43 provided on the left end of the axis 40 of the photosensitive member 30 (hereinafter, "photosensitive member axis" will be referred to). When properly positioned, the gap is provided between the left notch 29 and the collar 43 so that the collar 43 is not brought into contact with the left side wall 20L.

Inside of the right side wall 20R and the left side wall 20L, a guide groove 25 is formed continuously respectively with the right notch 26 and the left notch 29. This guide groove 25 guides guide pins 45R, 45L arranged at both ends of the developing unit 3 so as to approximately position the developing unit 3 in the carriage 2. Moreover, in a state in which the developing unit 3 is installed in the carriage 2, the developing unit 3 can be rotated with the guide pins 45R, 45L as the center by the amount of the gap between the coupling plate 42 and the right notch 26, and by the amount of the gap between the color 43 and the left notch 29.

When four developing units 3 are installed in the carriage 2, the wall face of the waste toner case 37 of the developing unit 3 faces the wall face of the toner hopper 39 of the adjacent developing unit 3. With such a structure, the cylindrical space of the carriage 2 is used efficiently. Moreover, a protruding portion or member (not shown), which protrudes inward to the peripheral portion of the both sides wall 20R, 20L of the carriage 2, is provided. Thereby the developing unit 3 is inhibited from being detached from the carriage 2.

In FIGS. 2 and 3, numeral 28 denotes a carriage gear, which is integrally formed on the outside of the left wall 20L of the carriage 2, and connected to a carriage driving mechanism 86 provided at the side of the apparatus main body 1. The carriage driving mechanism 86 includes a worm gear 89 connected to a carriage driving motor 100, a worm wheel 88 that meshes with the worm gear 89, and a gear 87 that is formed as one piece with the worm wheel 88 and meshes with the carriage gear 28. The carriage 2 is supported rotatably by right and left side walls 1R and 1L of the apparatus main body 1 via bearings 46.

Exposure Device

As shown in FIGS. 1 and 3, a laser exposure device 6 for exposing the photosensitive member 30 is placed in the cylindrical drum 21 of the carriage 2. The laser exposure device 6 includes a semiconductor laser unit 6*a*, a polygon mirror 6*b*, a mirror 6*c*, lens 6*d*, and the like. These members are formed into one unit, and the unit is contained in a case. The laser beam 8, corresponding to a transient serial electrical pixel signal for image information, is emitted from the semiconductor laser unit 6*a* of the laser exposure device 6, and passes through the exposure windows 22 provided to the cylindrical drum 21 of the carriage 2. The laser beam 8 passes through an optical path 33 formed in the developing units 3, and enters the developing units 3 (3Y). The laser beam 8 is incident onto an exposure portion of the left side face of the photosensitive member 30, so as to scan and expose the photosensitive member 30 in the direction of the main line.

As shown in FIGS. 3 and 4, on both sides of the main body 63 of the laser exposure device 6, disk-shaped attaching plates 64R, 64L are fixed. To the central portion of the attaching plate 64R, a protruding portion 101 for positioning is provided. Furthermore, the attaching plate 64L is provided with a screwing hole 65, and the attaching plate 64R is provided with a screw hole 66.

The laser exposure device 6 including the attaching plates 64R, 64L is inserted into the cylindrical drum 21 from the left side wall 1L of the apparatus main body 1, and the protruding portion 101 is inserted into the hole provided in the central portion of the bearing 46 fixed to the right side wall 1R, and thereby the laser exposure device 6 is positioned. The laser exposure device 6 is fixed by the use of the screwing holes 65 and the screw hole 66 on the right and left attaching plates 64L and 64R. Therefore, the laser exposure device 6 is always in the state of repose regardless of the rotation of the carriage 2.

Control Circuit

Figure 7:
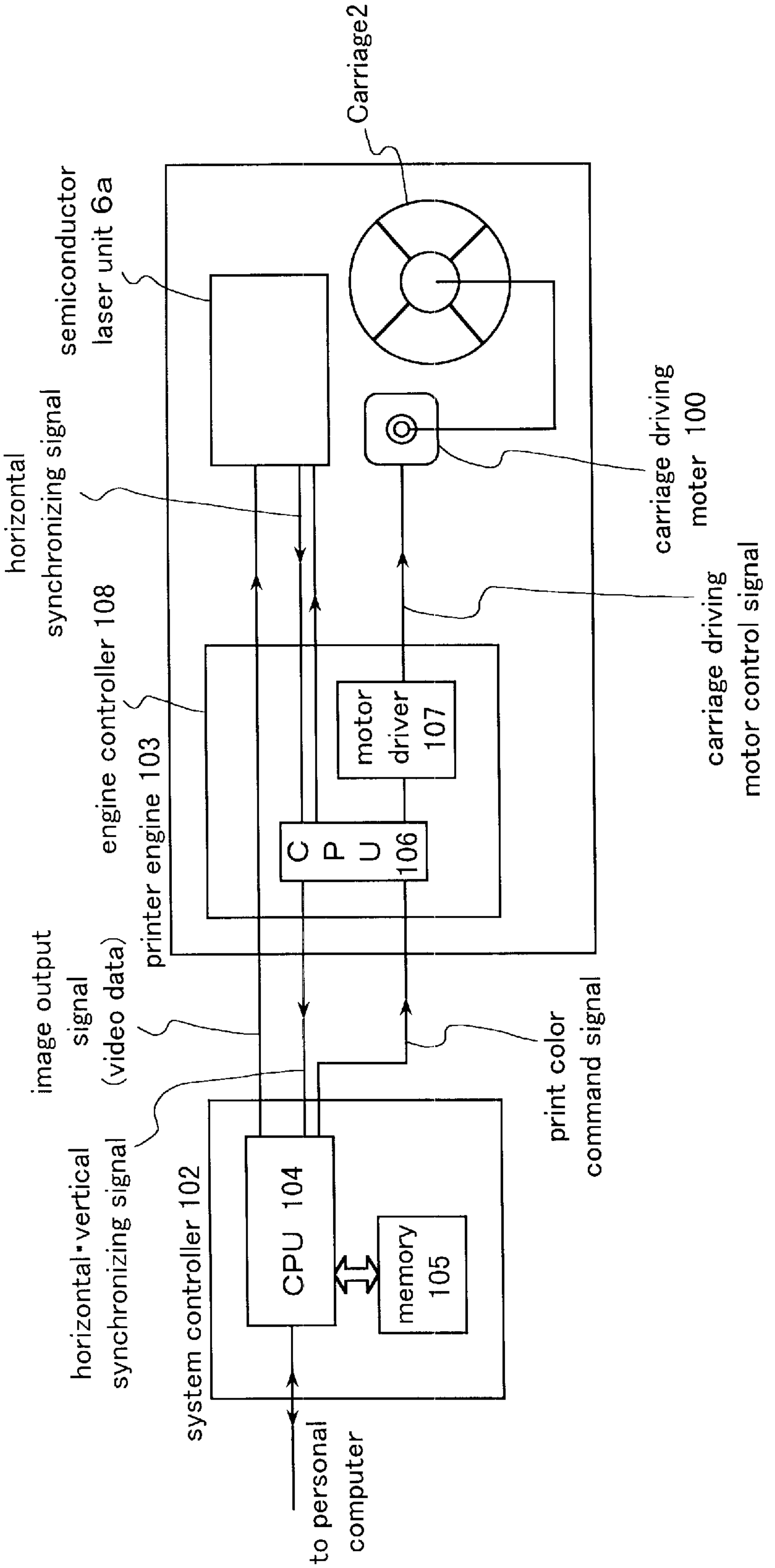
FIG. 7 is a schematic chart of a control circuit for controlling a semiconductor laser unit and a carriage driving motor of the color image forming apparatus in the first embodiment according to the present invention.

FIG. 7 is a schematic chart of a control circuit for controlling a semiconductor laser unit and a carriage driving motor of the color image forming apparatus in the first embodiment according to the present invention. As shown in FIG. 7, a control circuit for controlling the semiconductor laser unit 6*a* and carriage driving motor 100 includes a system controller 102 and a printer engine 103. The system controller 102 includes a CPU 104 and a memory 105, and the printer engine 103 has an engine controller 108 including a CPU 106 and a motor driver 107. A time series pixel signal of the image information (image output signal (video data)) is input to the semiconductor laser unit 6*a* from the CPU 104 of the system controller 102. Thereby, the laser beam 8 is released from the semiconductor laser unit 6*a*. The laser beam 8 corresponds to the time series pixel signal of the image information. Furthermore, a printing color command signal is input to the CPU 106 of the engine controller 108 from the CPU 104 of the system controller 102. Thereby, a carriage driving motor control signal is input to the carriage driving motor 100 from the CPU 106 of the engine controller 108 via the motor driver 107, and thus the carriage gear 28 fixed to the left side wall 20L of the carriage 2 is driven to be rotated through the predetermined angle via a worm gear 89, worm wheel 88, and gear 87. With this rotation of the carriage gear 28, the carriage 2 is rotated and the developing unit 3 corresponding to the printing color command signal moves to the image forming position 10.

Photosensitive Member Driving And Positioning Mechanism

As shown in FIGS. 2 and 3, a photosensitive member driving mechanism 60 and a detent mechanism 80 are provided at the side walls 1R and 1L of the apparatus main body 1 in order to position the photosensitive member 30 precisely at the image forming position 10.

The photosensitive member driving mechanism 60, which is attached to the right side wall 1R of the apparatus main body 1, includes an output axis 70, a coupling plate 61 that is fixed to the output axis 70 and rotates together as one piece with the output axis 70, an output axis driving gear 71, and a driving mechanism for driving these elements mentioned above. The output axis 70 is supported, movably in the thrust direction and rotatably, by the bearings 77 fixed to the side right wall 1R of the apparatus main body 1 and a base plate 67.

One end of the output axis 70 has a tip-tapered portion 75, which has a convex tapered surface corresponding to a convex tapered surface 48 formed on the right end of the photosensitive member axis 40. The other end of the output axis 70 has a spherical shape so as to be in contact with a thrust bearing 69 with small area. The output axis driving gear 71 is a helical gear that is fixed to the output axis 70 and meshes with a motor-side gear 72. The helical gear is twisted in the same direction as the rotation direction of the output axis driving gear 71. Numeral 74 denotes a compression spring that is inserted between the bearing 77 and the output axis driving gear 71. This compression spring 74 constantly urges the coupling plate 61 of the output axis 70 toward the position that is separated from the coupling plate 42 of the photosensitive member 30. The output axis 70 can be moved in the axis direction by the thrust bearing 69. The motor-side gear 72 has a sufficient length in the axis direction so that the output axis driving gear 71 constantly meshes with the motor side gear 72, even if the output axis 70 moves in the axis direction. When the output axis 70 moves in the axis direction, the output axis driving gear 71 and the motor side gear 72 move while sliding by the gear tooth surface relative to each other.

Next, the following is a description of the detent mechanism 80, which is attached to the left side wall 1L of the apparatus main body.

As shown in FIGS. 2 and 3, the detent mechanism 80 includes a guide plate 81, a detent lever 82, a solenoid 85 for moving the detent lever 82, and the like. The guide plate 81, which is fixed to the left side wall 1L of the apparatus main body, guides a collar 43 arranged at the left end of the photosensitive member axis 40 and near the image forming position 10 so as to position the collar 43 at a proper radial distance from the center of the carriage 2. The detent lever 82 is provided rotatably on the left side wall 1L of the apparatus main body by a support axis 83 and pushes the collar 43 to the guide plate 81 with a tip V-groove so as to position the collar 43 precisely. The detent lever 82 is connected to a plunger of the solenoid 85. With such a configuration, the solenoid 85 actuates the detent lever 82 by attraction of the plunger and the V-groove of the detent lever 82 pushes the collar 43 strongly against guide plate 81.

The component parts are arranged so that the straight line connecting between the center of the output axis 70 of the photosensitive member driving mechanism 60 and the center of the V-groove of the detent mechanism 80 are kept precisely parallel to the axis of the laser exposure device 6. In addition, play of the bearings is minimized. Therefore, the photosensitive member 30 is always positioned precisely at the image forming position 10 when the photosensitive member driving mechanism 60 and the detent mechanism 80 are actuated.

Apparatus Main Body Driving Mechanism

Next, the following is a description of the driving mechanism for driving a photosensitive member 30 and an intermediate transfer belt 50.

In FIG. 5, numeral 90 denotes a driving mechanism for driving the photosensitive member 30 and the intermediate transfer belt 50 and includes a first motor 95 as a driving source and reduction gears 92, 93 connected to the first motor 95. The reduction gear 93 is constructed so as to mesh with the pulley gear 94 fixed to a driving pulley 55*a* when the transfer belt unit 5 is installed. Furthermore, the reduction gear 92 meshes with the output axis driving gear 71, and thereby the photosensitive member 30 can be rotated. Numeral 91 denotes a motor gear meshing with the reduction gear 92 and an idler gear 96. Moreover, the rotation ratios of these gears are set to be integral ratios with respect to one revolution of the intermediate transfer belt 50. The outer diameter of the driving pulley 55*a* is about 30 mm. In this configuration, while the driving pulley 55*a* rotates four times, the intermediate transfer belt 50 makes precisely one rotation. Furthermore, the rotation ratio of the pulley gear 94 fixed to the driving pulley 55*a* to the reduction gear 93 is set to be 1:2. The rotation ratio of the reduction gear 93 to the motor gear 91 is set to be 1:3. Furthermore, the outer diameter of the photosensitive member 30 is also 30 mm. The photosensitive member 30 rotates four times while the intermediate transfer belt 50 makes one rotation, so that the rotation of the photosensitive member 30 is in synchronization with the rotation of the driving pulley 55*a*. The rotation ratio of the output axis driving gear 71 to the reduction gear 92 is 1:2, and the rotation ratio of the reduction gear 92 to the motor gear 91 is 1:3. Moreover, in the case of differentiating the peripheral speed of the photosensitive member 30 from that of the intermediate transfer belt 50 in order to prevent the failure of transfer, or in the case where the peripheral speed of the belts are changed depending upon variation in the thickness of the intermediate transfer belt 50, the outer diameter of the photosensitive member 30, the outer diameter of the driving pulley 55*a* and the peripheral length of the belt may be adjusted appropriately. Also in this case, the rotation ratio of the driving pulley 55*a* and the photosensitive member 30 with respect to one revolution of the intermediate transfer belt 50 are set to be integral ratios, respectively.

Intermediate Transfer Belt And Photosensitive Member

In FIG. 6, the transfer belt unit 5 is positioned and fixed between the left and right side walls 1L and 1R of the apparatus main body. At this time, the peripheral portion of the photosensitive member 30 positioned to the image forming position 10 is located at the inner place from the common tangent line of the guide roller 55*c* and tension roller 55*d*. Therefore, a certain pressure is applied to the peripheral surface of the intermediate transfer belt 50 and photosensitive member 30, so that both are uniformly in contact with each other. For example, as shown by the arrow in FIG. 6, by providing about 20–30N of spring power to the tension roller 55*d*, sufficient transferring performance was obtained. At this time, the width of the intermediate transfer belt 50 was about 250 mm.

Moreover, when the carriage 2 is rotated and the developing units 3 are switched, the photosensitive member 30 moves, sliding on the surface of the intermediate transfer belt 50. However, the intermediate transfer belt 50 performs one revolution every time a toner image of one color is transferred and stops in a state in which the non-image region in which images are not formed is in contact with the photosensitive member 30. Therefore, when the developing units 3 are switched, turbulence of the image does not occur.

Figure 8:
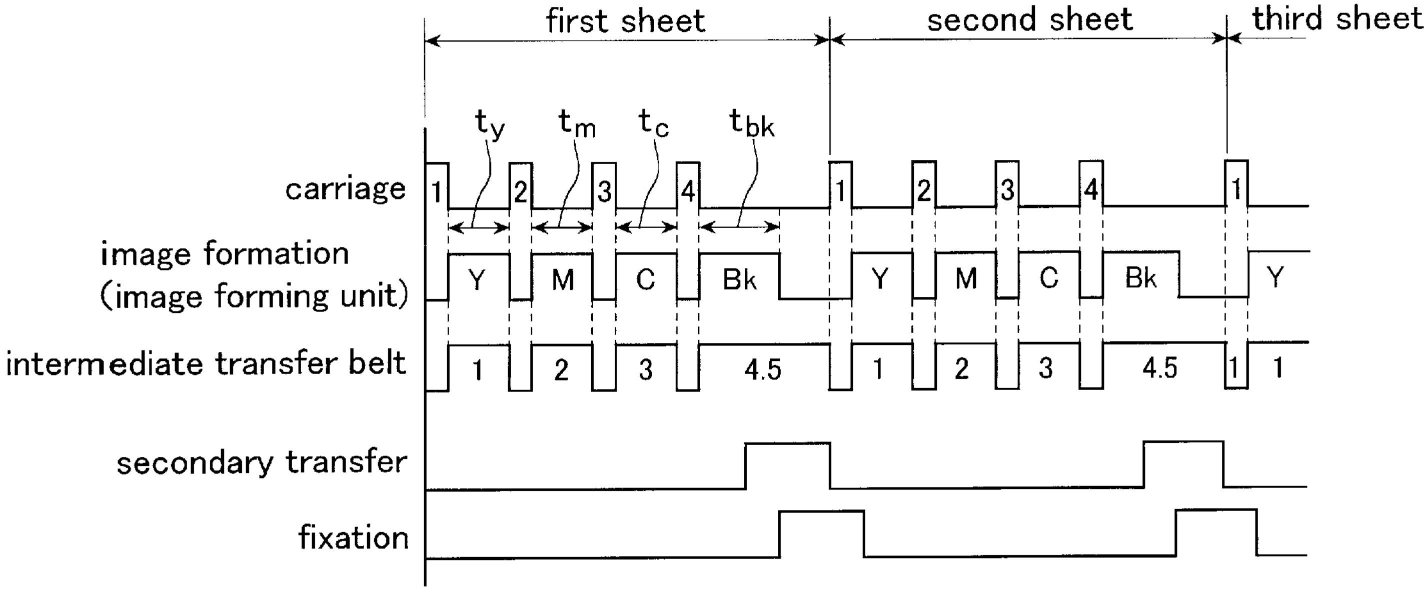
FIG. 8 is a time chart showing an image forming operation of the color image forming apparatus in the first embodiment according to the present invention.

Next, the following is a description of the operation of the image forming apparatus with the above configuration, with reference to FIG. 8. FIG. 8 is a time chart showing an image forming operation of the color image forming apparatus in the first embodiment according to the present invention.

As shown in FIG. 1, when the transfer belt unit 5 and developing units 3 for all colors are installed in their predetermined locations, the power for the apparatus main body 1 is turned on, and the fixing device 15 is heated up, while the polygon mirror 6b of the laser exposure device 6 starts to be rotated, thus completing the preparations.

Moreover, right after the power is turned on, the initialization mode may be operated for adjusting the state of the photosensitive member 30 and the intermediate transfer belt 50.

After these preparations are completed, an image formation by the developing unit 3Y for yellow starts. In the standing state, usually, the developing unit 3Bk for black is located at the image forming position 10. Therefore, first, the carriage 2 is rotated 90° so as to move the developing unit 3Y for yellow to the image forming position 10. Namely, by rotating a carriage driving motor 100, to thus rotate the warm gear 89 of FIG. 2, thereby rotating the carriage 2 in the arrow direction shown in FIG. 1. Thus the developing unit 3Y for yellow is moved to the image forming position 10.

When the carriage 2 is rotated, the compression spring 74 urges the output axis 70 of the photosensitive member driving mechanism 60 backward, so that the tip-tapered portion 75 and the coupling plate 61 are separated from the coupling plate 42 of the photosensitive member 30 side. Furthermore, in this case, the solenoid 85 of the detent mechanism 80 is also turned off and the detent lever 82 is moved to the waiting position. Furthermore, in this case, a first motor 95 is stopped. The development unit 3Y for yellow moves sliding along the surface of the intermediate transfer belt 50, and when it comes near the image forming position 10, the carriage driving motor 100 stops, the worm gear 89 stops, and the carriage 2 is locked in this position.

When the carriage 2 stops, the solenoid 85 of the detent mechanism 80 is immediately turned on, so that the detent lever 82 urges the collar 43 of the photosensitive member axis 40 against the guide plate 81. The collar 43 is positioned at a specified position by being sandwiched between the V-groove of the detent lever 82 and guide plate 81.

Simultaneously, the thrust bearing 69 pushes the output axis 70 out against the spring force in the left direction of FIG. 3. As the output axis 70 is pushed out in the left direction of FIG. 3, the tip-tapered portion 75 of the output axis 70 starts to engage the concave tapered surface 48 of the photosensitive member axis 40 and moves forwards while shifting the photosensitive member axis 40 so as to align it with the center of the output axis 70. When the thrust bearing 69 pushes the output axis 70 further, the tip-tapered portion 75 engages the concave tapered surface 48, and the center of the photosensitive member axis 40 aligns completely with the center of the output axis 70. Thus, the photosensitive member 30 is positioned precisely at the image forming position 10. Furthermore, when the tip-tapered portion 75 engages the concave tapered surface 48, the coupling plates 42 and 61 engage each other, so that a rotational force of the output axis 70 can be transmitted to the photosensitive member 30.

After the positioning and coupling of the photosensitive member 30 is completed, the first motor 95 for driving the photosensitive member 30 and intermediate transfer belt 50 starts to be rotated, and then the photosensitive member 30 for yellow and the intermediate transfer belt 50 start to be rotated. At the same time these start to move, the developing device 35 and the corona charger 34 also start to move. The driving pulley 55*a* is driven, and thereby the intermediate transfer belt 50 is rotated due to friction forces in the arrow direction of FIG. 1. At this time, the peripheral speed of the photosensitive member 30 is substantially the same as that of the intermediate transfer belt 50. Furthermore, the secondary transfer roller 9 and the cleaning blade 53 are separated from the intermediate transfer belt 50.

The head position of the intermediate transfer belt 50 is detected when the photosensitive member 30 and the intermediate transfer belt 50 attain a stable speed and a part of the surface of the photosensitive member 30 being homogeneously charged reaches to the exposing position, and then the irradiation of the laser beam 8 from the laser exposure device 6 is started. When the photosensitive member 30 homogeneously charged is irradiated with laser beam 8 modulated by the image output signal, an electrostatic latent image corresponding to the image output signal is formed, thus toner images are sequentially appeared by the developing device 35.

The toner images formed on the photosensitive member 30 are moved toward the primary transfer position while being in contact with the intermediate transfer belt 50 by the rotation of the photosensitive member 30. At this primary transfer position, the toner images are sequentially transcribed onto the intermediate transfer belt 50. This operation is continued by the region of one A4 image. During this time, the thrust bearing 69 pushes the output axis 70 out in the left direction of FIG. 2, the solenoid 85 is maintained in "on" state, and the detent lever 82 continues to sandwich the color 42. The yellow image forming operation is completed after the end of the image is transferred onto the intermediate transfer belt 50, and the first motor 95 stops, thereby the photosensitive member 30 and the intermediate transfer belt 50 stop.

When the photosensitive member 30 and intermediate transfer belt 50 stop, the solenoid 85 of the detent mechanism 80 is turned off, and the detent lever 82 is released. At the same time, thrust bearing 69 moves backward in the right head direction in FIG. 2, and the output axis 70 moves backward in the right direction due to the restoring force of the compression spring 74. Thus, the coupling plate 61 and the tip-tapered portion 75 are separated from the coupling plate 42 and the photosensitive member axis 40. With this operation, the coupling of the photosensitive member axis 40 and the output axis 70 is released, thus permitting the rotation of carriage 2.

The coupling of the photosensitive member axis 40 and the output axis 70 is released, the carriage driving motor 100 starts to rotate again, the worm gear 89 is rotated again, and the carriage 2 is rotated only 90° in the arrow direction of FIG. 1. Thereby, the developing unit 3M for magenta is moved to near the image forming position 10 and stops there. Then, the detent mechanism 80 and photosensitive member driving mechanism 60 operate, and the photosensitive member 30 for magenta is positioned. Thereafter, the coupling operation of the photosensitive member axis 40 and the output axis 70 is carried out, the first motor 95 starts to be rotated, and the image forming operation for the second color, magenta starts. As a result, a magenta toner image is formed overlapping a yellow toner image on the intermediate transfer belt 50.

In this way, sequential switching operations of the developing units 3 and image forming operations are repeated for the third color, cyan, and fourth color, black. Thus, four toner images are formed on the intermediate transfer belt 50.

When the top of the image on the intermediate transfer belt 50 on which the last toner image of black is transferred reaches the secondary transfer position, the secondary transfer roller 9 pushes the recording paper onto the intermediate transfer belt 50 and the secondary transfer of the toner image onto the recording paper starts. The four toner images on the intermediate transfer belt 50 are transferred onto the recording paper together. When the secondary transfer starts, the image forming process on the photosensitive member 30 is continued. The primary transfer from the photosensitive member 30 onto the intermediate transfer belt 50 and the secondary transfer from the intermediate transfer belt 50 onto the recording paper simultaneously proceed.

When the primary transfer of the black toner image from the photosensitive member 30 onto the intermediate transfer belt 50 is completed, the top of four toner images, which is transferred onto the recording paper, starts to pass through a fixing device 15. Thereby, the recording paper on which four toner images are transferred is fixed and ejected out of the apparatus by paper eject rollers 18. Even if the primary transfer of the black toner image from the photosensitive member 30 onto the intermediate transfer belt 50 is completed, the secondary transfer from the intermediate transfer belt 50 onto the recording paper continues. Therefore, the photosensitive member 30 and the intermediate transfer belt 50 continue to be rotated. At this time, the photosensitive member 30 is not irradiated with the laser signal beam 8, and the photosensitive member 30 and the developing device 35 are in a so-called idling state.

When the intermediate transfer belt 50 is rotated 4.5 times, the secondary transfer of the toner image from the intermediate transfer belt 50 onto the recording paper is completed, and the photosensitive member 30 and the intermediate transfer belt 50 stop.

Thereafter, the coupling and detent of the photosensitive member 30 and the apparatus main body are released, and the carriage 2 is rotated 90°, so that the image formation is started again from yellow.

By repeating the above-mentioned operations, a plurality of color images are output successively.

Any toner remaining on the intermediate transfer belt 50 after secondary transfer is scraped off by the cleaning blade 53 that is in contact with the intermediate transfer belt 50. The scraped-off toner is collected into the waste toner case 57 by a screw 53*a*.

In the above-mentioned image forming operation, in the four developments and primary transfer by the toner of yellow (Y), magenta (M), cyan (C), and black (Bk) for forming one sheet of color image, the development and primary transfer of the toner of the last color, black, is performed at a different speed from that of the toner of the other colors. In this embodiment, the development and primary transfer by the toner of the last color, black, is performed slower than that by the toners of the other colors. Furthermore, the secondary transfer and fixation are performed at the same speed as the development and primary transfer by the toner of the last color, black.

As mentioned above, when the development to the photosensitive member 30 and primary transfer onto the intermediate transfer belt 50 by the toner of the last color, black, and the secondary transfer onto the recording paper and fixation are performed simultaneously, by differentiating the speed of the developing onto the photosensitive member 30 and the primary transfer onto the intermediate transfer belt 50 by the toner of the color other than the black from the speed of the secondary transfer onto the recording paper and the fixation, it is possible to set differently the performance in the secondary transfer and fixation from the performance in the development and primary transfer. As a result, it is possible to optimize the cost performance of the secondary transfer roller 9, intermediate transfer belt 50 (secondary transfer means) and the fixing device 15 (fixing means). Therefore, for example, since the secondary transfer speed and fixing speed are matched to the high performance developing speed and primary transfer speed, it is not necessary to introduce a large size and expensive transfer device and fixing device.

Furthermore, when the performance in the secondary transfer and fixation is higher than that of the development and primary transfer, by enhancing the performance in the development and the primary transfer by the black toner and by using the black toner as a last color, it is possible to reduce the total printing time. Since the black toner has no limitation in permeability as compared with the toners of the other colors, there are many choice in base materials and additives and it is relatively easy to enhance the performance in the development and primary transfer.

For example, when the time for the operation of switching the developing unit 3 by rotating the carriage 2, 90° and coupling of the photosensitive member 30, etc., is 1.0 second, the speed of the development and the primary transfer by each toner of yellow (Y), magenta (M), and cyan (C) is 150 mm/second, the the speed of the development and the primary transfer by the toner of black (Bk) is 100 mm/second, and the peripheral length of the intermediate transfer belt 50 is 377 mm, the time for outputting one sheet of color image is expressed by:

$$T=1.0\times 4+(377/150)\times 3+(377/100)\times 1.5=17.2 \text{ seconds.}$$

This shows that it is possible to realize the higher speed by 18% than the case of the conventional color image forming apparatus (21 seconds).

Furthermore, in the above-mentioned color image forming apparatus, the following expression is satisfied (see FIG. 1):

$$L1<Lp, L2<Lp,$$

wherein L1 denotes a distance, along the direction where the intermediate transfer belt 50 moves, between a primary transfer position where the photosensitive member 30 located at the image forming position 10 is pressed into contact with the intermediate transfer belt 50 and a secondary transfer position where the secondary transfer roller 9 is pressed into contact with the guide pulley 55*b* via the intermediate transfer belt 50; L2 denotes a distance, along the paper guide 13*c*, between the secondary transfer position and the fixing device 15 (fixing position), and Lp denotes a length of the recording paper in the conveying direction. Satisfying the above-mentioned relationship achieves the compact size of the overall configuration of the apparatus. In this case, in order to minimize the total time of color printing, it is essential to perform the secondary transfer onto the recording paper the moment the development onto the photosensitive member 30 and the primary transfer onto the intermediate transfer belt 50 are performed by the toner of the last color, black. Also in the apparatus having such a configuration, by performing the development onto the photosensitive member 30 and the primary transfer onto the intermediate transfer belt 50 by the toner of the last color, black, and the development and the primary transfer by the toners of the other colors at the different speeds, it is possible to utilize the performance of the apparatus most effectively.

Moreover, in this embodiment, each of the plurality of the developing units 3 integrates the photosensitive member 30, respectively, but there is no necessary limitation to this configuration. For example, the photosensitive member 30 may be provided separately from the developing unit 3.

Furthermore, in this embodiment, the color image forming apparatus includes four developing units for each color; yellow, magenta, cyan, and black, and the last color in the primary transfer is black. However, there is no necessary limitation to this configuration, as long as the last color in the primary transfer is yellow or black, even if the color misalignment is somewhat increased due to the difference in the image forming speed, it is less remarkable than the color misalignment of the magenta and cyan.

Figure 9:
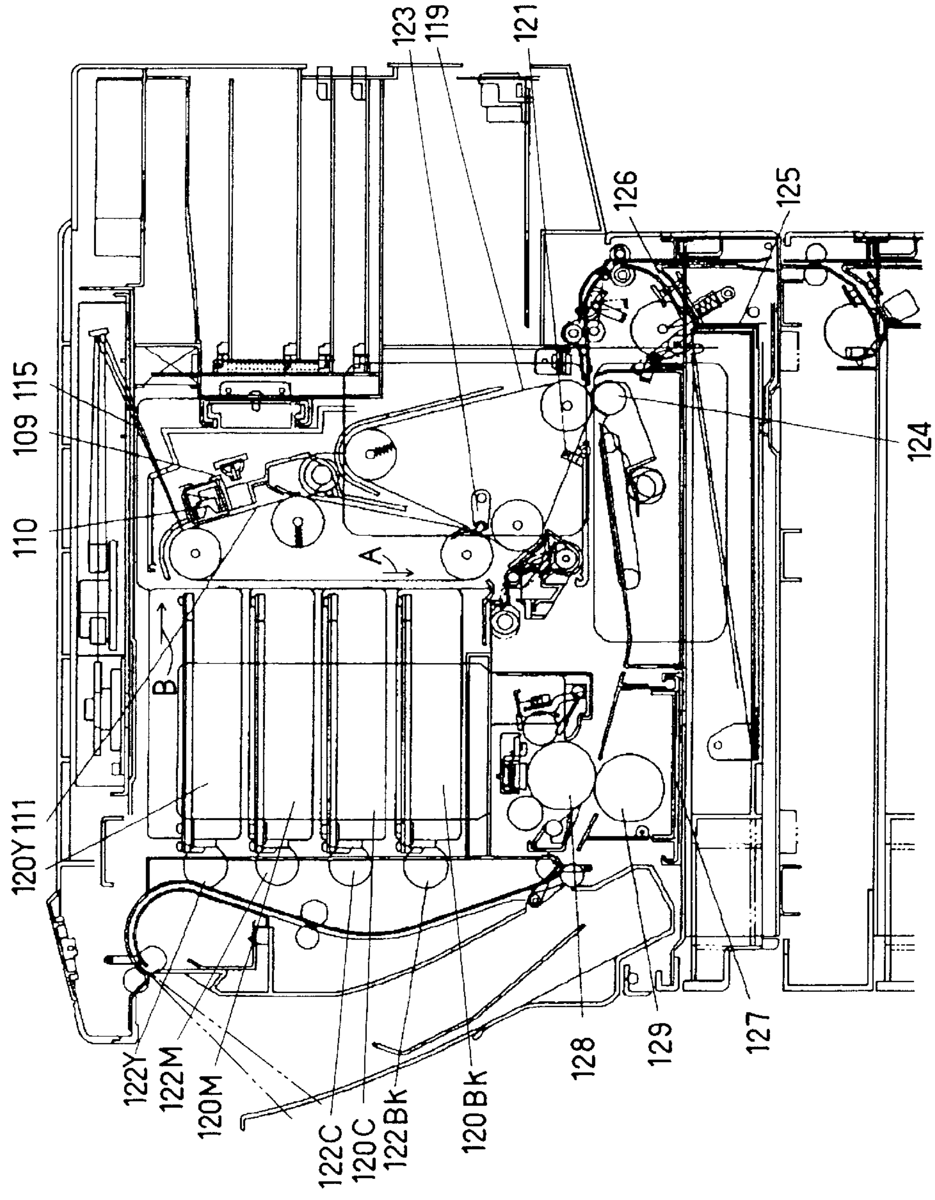
FIG. 9 is a cross-sectional view showing another example of the overall configuration of the color image forming apparatus in the first embodiment according to the present invention.
Figure 10:
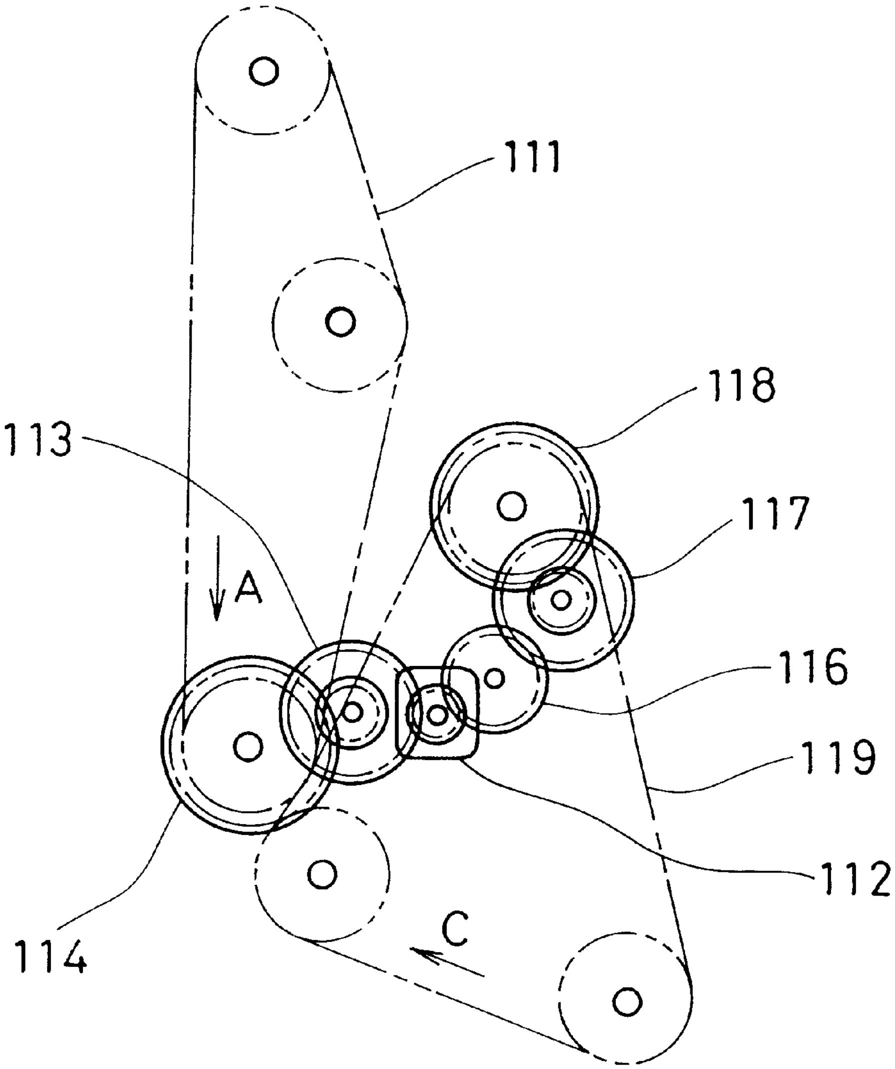
FIG. 10 is a view showing another example of the transmission system of the driving mechanism at the apparatus main body side, which drives the photosensitive member and the intermediate transfer belt of the color image forming apparatus in the first embodiment according to the present invention.

Furthermore, in the color image forming apparatus of this embodiment, the carriage 2 is supported rotatably by the apparatus main body and the developing unit 3 is driven to rotate. However, there is no necessary limitation to this configuration. It is possible to employ, for example, the color image forming apparatus having a configuration shown in FIG. 9. FIG. 9 is a cross-sectional view showing another example of the overall configuration of the color image forming apparatus in the first embodiment according to the present invention; and FIG. 10 is a view showing another example of the transmission system of the driving mechanism at the apparatus main body side, which drives the photosensitive member and the intermediate transfer belt of the color image forming apparatus in the first embodiment according to the present invention.

Hereinafter, the operation of the color image forming apparatus shown in FIG. 9 will be described with reference to FIG. 10.

First, by applying high voltage to the charging line 110 in the charger 109 connected to the high voltage power supply so as to effect a corona discharge, the surface of the photosensitive belt 111 is uniformly charged to about −700V. Then, the photosensitive belt driving gear 114 is rotated by the rotation of the motor 112 via the idler gear 113, and the photosensitive belt 111 is rotated in the direction of the arrow A. Thus, the surface of the uniformly charged photosensitive belt 111 is irradiated with the laser exposing beam 115 corresponding to yellow (Y). Thereby, electric charges on the irradiated part of the photosensitive member 111 are lost, and an electrostatic latent image is formed. At this time, by the rotation of the motor 112, the intermediate transfer belt driving gear 118 is rotated via the idler gears 116, 117, and thereby the intermediate transfer belt 119 is rotated in the direction of arrow C. On the other hand, after an intermediate transfer belt standard detecting sensor 121 detects the standard mark and the predetermined time has passed, the developing unit 120Y for yellow is pushed in the direction of the arrow B by the rotation of the cam 122Y so as to be brought into contact with the photosensitive belt 111. With this contact, the yellow toner is attached to the electrostatic latent image part formed on the photosensitive belt 111, and thus the developing is completed. The developing unit 120Y for yellow in which the developing is completed moves from the contact position with the photosensitive belt 111 to the separating position, by 180° rotation of the cam 122Y. The yellow toner image formed on the photosensitive belt 111 by the developing unit 120Y is transferred onto the intermediate transfer belt 119 by applying high voltage to the intermediate transfer roller 123 arranged so as to bring the intermediate transfer belt 119 into contact with the photosensitive belt 111 (primary transfer).

Next, when magenta (M) is selected, the cam 122M is rotated, to push the developing unit 120M for magenta to the direction of the photosensitive belt 111, so as to press into contact with the photosensitive belt 111. Thus, the developing of magenta starts. The developments of cyan (C) and black (Bk) are performed continuously so as to form a color image by the toner images of yellow (Y), magenta (M), cyan (C) and black (Bk) on the intermediate transfer belt 119. The thus formed color image on the intermediate transfer belt 119 is secondarily transferred onto the recording paper together by moving the recording paper transfer roller 124, which has been separated from the intermediate transfer belt 119, in the direction in which both are brought into contact with each other; by applying the high voltage to the recording paper transfer roller 124; and by pushing the recording paper conveyed along the recording paper conveying path 126 from the recording paper cassette 125 to the intermediate transfer belt 119 by the recording paper transfer roller 124.

Also, in the color image forming apparatus having this configuration, at the time the secondary transfer starts, the image forming process on the photosensitive belt 111 by the last color, black (Bk), is continued. The primary transfer from the photosensitive belt 111 onto the intermediate transfer belt 119 and the secondary transfer from the intermediate transfer belt 119 onto the recording paper simultaneously proceed.

Next, the recording paper on which the color image is secondarily transferred is conveyed to the fixing device 127 and fixed by heat from a heat roller 128 and pressure of pressure roller 129, and is ejected out of the apparatus.

Also in the color image forming apparatus having this configuration, in the four developments and primary transfer by the toner of yellow (Y), magenta (M), cyan (C), and black (Bk) for forming one sheet of color image, the development and primary transfer by the toner of the last color, black is performed at a different speed from that of the toners of the other colors. Furthermore, the secondary transfer and fixation are performed at the same speed as that of the development and primary transfer by the toner of the last color, black.

Furthermore, also in the color image forming apparatus having this configuration, the following expression is satisfied:

$$L1<Lp, L2<Lp,$$

wherein L1 denotes a distance, along the direction where the intermediate transfer belt 119 moves, between a primary transfer position where the intermediate transfer roller 123 is located and a secondary transfer position where the recording paper transfer roller 124 is located; L2 denotes a distance, along the recording paper conveying path, between the secondary transfer position and the fixing position where the fixing device 127 is located; and Lp denotes a length of the recording paper in the conveying direction.

Furthermore, in this embodiment, the color image forming apparatus includes four developing units for each color; yellow, magenta, cyan and black. However, there is no necessary limitation to this configuration. For example, a color image forming apparatus in which three or five developing units having different colors are included can be used.

Second Embodiment

Figure 11:
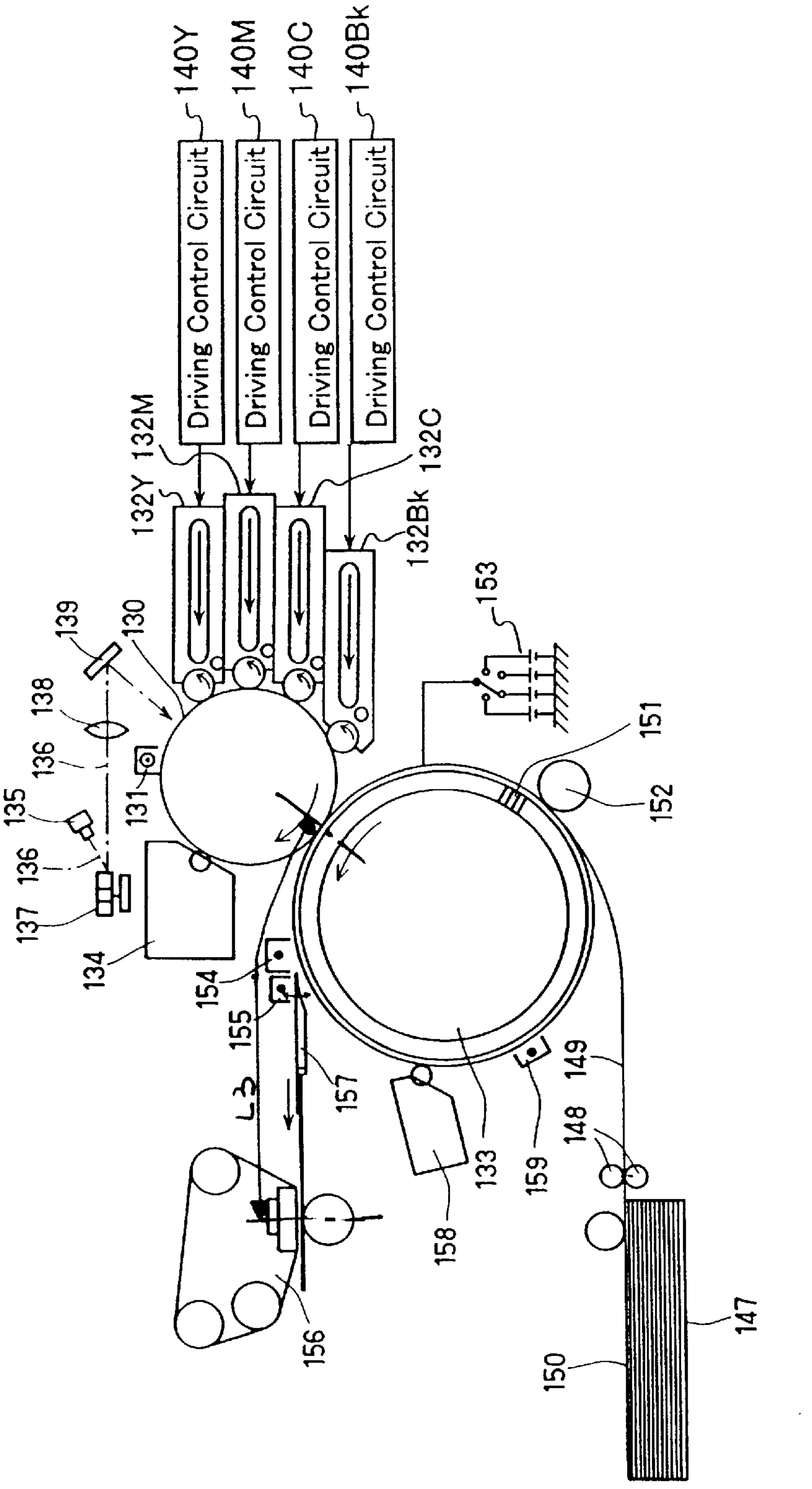
FIG. 11 is a cross-sectional view showing an overall configuration of a color image forming apparatus in a second embodiment according to the present invention.
Figure 12:
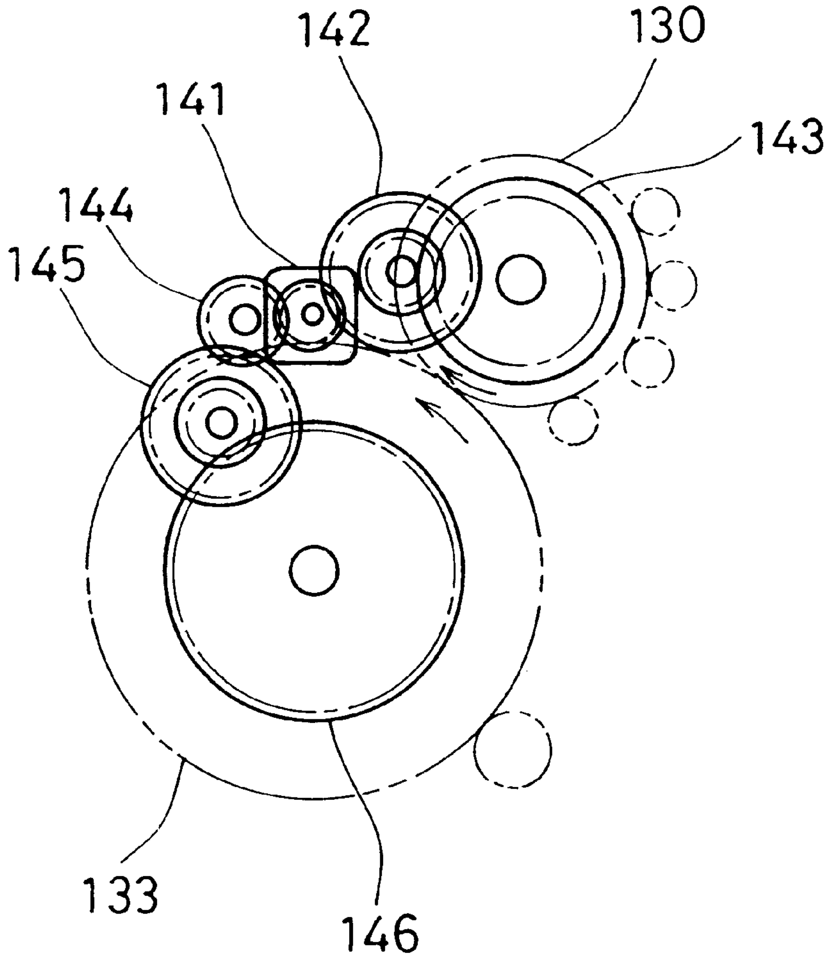
FIG. 12 is a view showing a transmission system of a driving mechanism at an apparatus main body side, which drives a photosensitive drum and a transfer drum of the color image forming apparatus in the second embodiment according to the present invention.

FIG. 11 is a cross-sectional view showing an overall configuration of a color image forming apparatus in a second; embodiment according to the present invention. FIG. 12 is a view showing a transmission system of a driving mechanism at an apparatus main body side, which drives a photosensitive drum and a transfer drum of the color image forming apparatus in the second embodiment according to the present invention.

In FIG. 11, the photosensitive drum 130 is always rotated in the arrow direction. Along the rotation direction of the photosensitive drum 130, a charger 131 for uniformly charging the photosensitive drum 130; four developing units 132Y, 132M, 132C and 132Bk, which respectively contain the toner of yellow (Y), magenta (M), cyan (C) and black (Bk), and which develop the electrostatic latent images; a transfer drum 133 for transferring the toner image onto the recording paper; and a cleaner 134 for removing the toner remaining on the photosensitive drum 130, are arranged respectively. The formation of an electrostatic latent image onto the photosensitive drum 130 is performed as in the below-mentioned manner. A semiconductor laser 135 is driven by the video signal generated by a printer controller (not shown) based on the image signal from a host computer (not shown), to emit a laser beam 136. The laser beam 136 emitted from the semiconductor laser 135 and modulated by the image signal passes through a rotation mirror 137, an imaging lens 138 and a reflection lens 139 and raster scans a photosensitive drum 130. Thereby, an electrostatic latent image is formed on the photosensitive drum 130.

Furthermore, the developing units 132Y, 132M, 132C and 132Bk have driving control circuits 140Y, 140M, 140C, and 140Bk each driving the developing units 132Y, 132M, 132C and 132Bk, respectively. These driving control circuits 140Y, 140M, 140C, and 140Bk are allowed to be turned on/off in accordance with a plurality of recording cycles by a control system (not shown) and develop the electrostatic latent image formed on the photosensitive drum 130 into a visible image by the predetermined colors of toner. Namely, the driving control circuits 140Y, 140M, 140C, and 140Bk, and the control means switch the developing units 132Y, 132M, 132C and 132Bk by moving them selectively between an image forming position and other positions.

As shown in FIG. 12, the photosensitive drum 130 is rotated in the arrow direction by rotating a photosensitive drum driving gear 143 via an idler gear 142 by the rotation of a motor 141. At this time, by the rotation of the motor 141, the transfer drum driving gear 146 also is rotated via the idler gears 144, 145 and the transfer drum 133 is rotated in the arrow direction.

As shown in FIG. 11, the transfer drum 133 is supported axially at its center and is capable of rotating in the arrow direction. And the transfer drum 133 faces the photosensitive drum 130 in a state in which it is in contact with the surface of the photosensitive drum 130, or it is slightly separated from the photosensitive drum 130. This transfer drum 133 sandwiches the recording paper 150 between a gripper 151 and an adsorption roller 152, holds it while adsorbing electrostatically, and conveys it. The recording paper is fed from a paper feed cassette 147 via a pair of resist rollers 148 and a paper feed guide 149. Furthermore, outside the transfer drum 133 is provided with, along the rotation direction thereof, a bias applying device 153 for applying a transfer bias to the transfer drum 133, an electricity separation removing device 154, 155 for separating the recording paper 150 onto which the toner image is transferred from the transfer drum 133, a separation hook 157 for helping separation and guiding the separated recording paper 150 to a recording paper conveying path for conveying the recording paper to a fixing device 156, a transfer drum cleaner 158 for removing the toner remaining on the surface of the transfer drum 133 from which the recording paper is separated, and an electricity removing device 159 for removing the transfer bias applied to the transfer drum 133 and initializing.

In the color image forming apparatus having the above-mentioned configuration, when the power is turned on, the transfer drum 133 is allowed to operate for a certain time and then is stopped. And the color image forming apparatus waits for the print starting signal from the host computer or printer controller (not shown). After receiving the printing starting signal, the rotation process of the photosensitive drum 130 and the transfer drum 133 in the image forming process is started. Then, based on the image signal from the host computer or printer controller, the driving control circuit 140 of the corresponding developing unit is operated so as to drive the driving source. Thereby, the developing sleeve of the corresponding developing unit 132 is driven and at the same time, the predetermined bias voltage is applied. Through the process of charging and exposure, the electrostatic latent image formed on the photosensitive member 130 is developed into a visible image. This visible image is transferred onto the recording paper 150 supported by the transfer drum 133 in the transfer region.

The processes of charging, exposure, development, and transfer are repeated in the order of yellow (Y)—magenta (M)—cyan(C)—black (Bk). The predetermined color image is formed on the recording paper 150 supported by the transfer drum 133. Then, the recording paper 150 on which the predetermined color image is formed is separated from the transfer drum 133, passes through the fixing device 156 and is ejected out of the apparatus.

In the color image forming apparatus of this embodiment, in the four developments and transfer by the toner of yellow (Y), magenta (M), cyan (C), and black (Bk) for forming one sheet of color image, a development and transfer of the toner of the last color, black is performed at a different speed from that of the toners of the other colors. Furthermore, the fixation is performed at the same speed as that of the development and transfer of the toner of the last color, black. Consequently, in the configuration of this embodiment, the same effect can be obtained as in the first embodiment.

Furthermore, in the color image forming apparatus of this embodiment, the following expression is satisfied:

$$L3<Lp,$$

wherein L3 denotes a distance, along the conveying path of the recording paper 150, between the transfer position in which the visible images (toner image) is transferred onto recording paper 150 (the position in which the transfer drum 133 faces the photosensitive drum 130 in a state in which the transfer drum 133 is in contact with the surface of the photosensitive drum 130, or the transfer drum 133 is slightly separated from the photosensitive drum 130) and the fixing position (the position in which the recording paper 150 is in contact with the fixing device 156), and Lp denotes a length of the recording paper 150 in the conveying direction. Consequently, it is possible to make the overall configuration of the apparatus to be a compact size.

Furthermore, in this embodiment, the color image forming apparatus includes four developing units for each color; yellow, magenta, cyan and black, and the last color in the transfer onto the recording paper 150 is yellow or black. However, there is no necessary limitation to this configuration, as long as the last color in the transfer onto the recording paper 150 is yellow or black, even if the color misalignment is somewhat increased due to the difference in the image forming speed, it is less remarkable than the color misalignment of the magenta and cyan.

Furthermore, in this embodiment, the color image forming apparatus includes four developing units for each color; yellow, magenta, cyan and black. However, there is no necessary limitation to this configuration. For example, a color image forming apparatus in which three or five developing units having different colors are included can be used.

Third Embodiment

Figure 13:
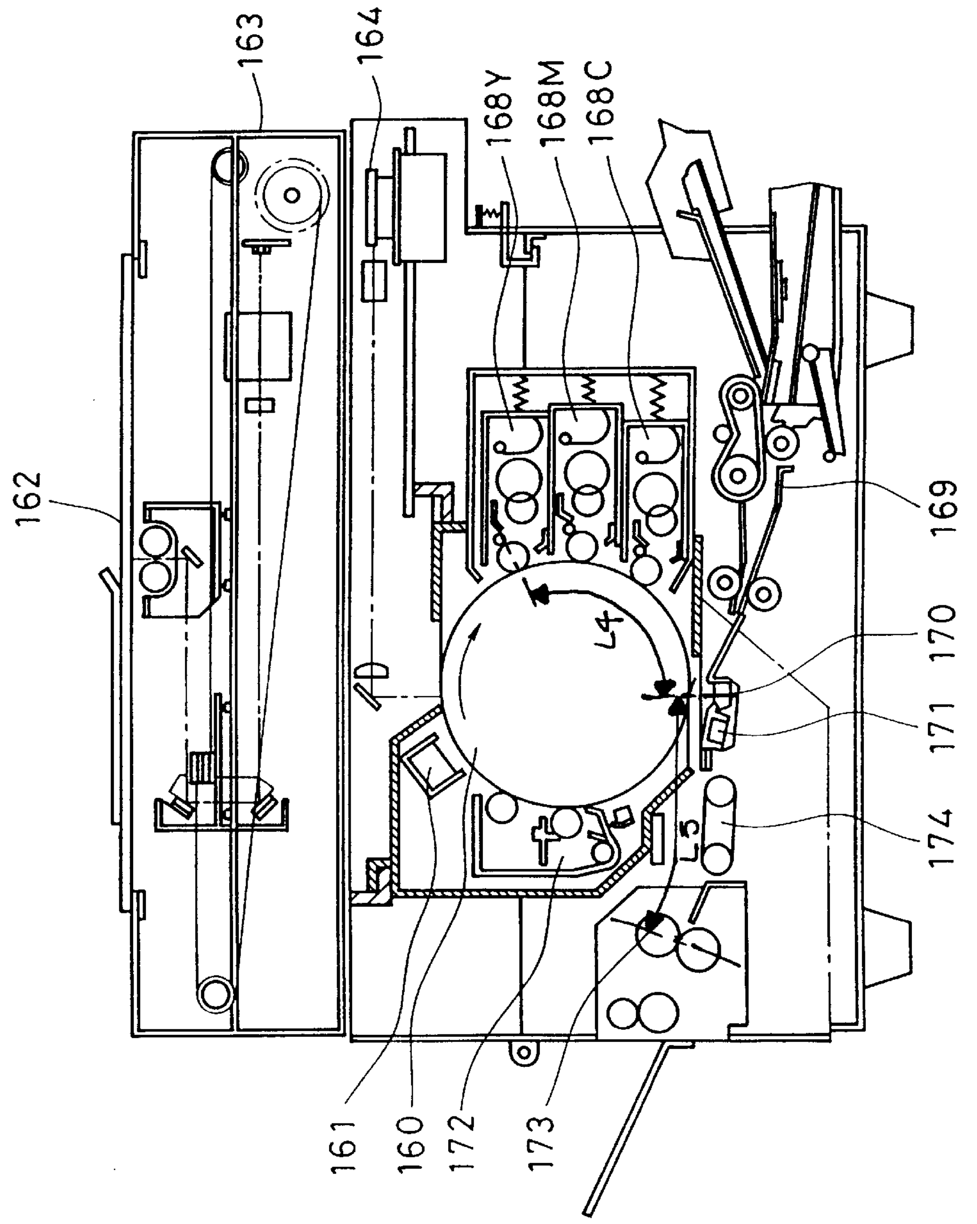
FIG. 13 is a cross-sectional view showing an overall configuration of a color image forming apparatus in a third embodiment according to the present invention.
Figure 14:
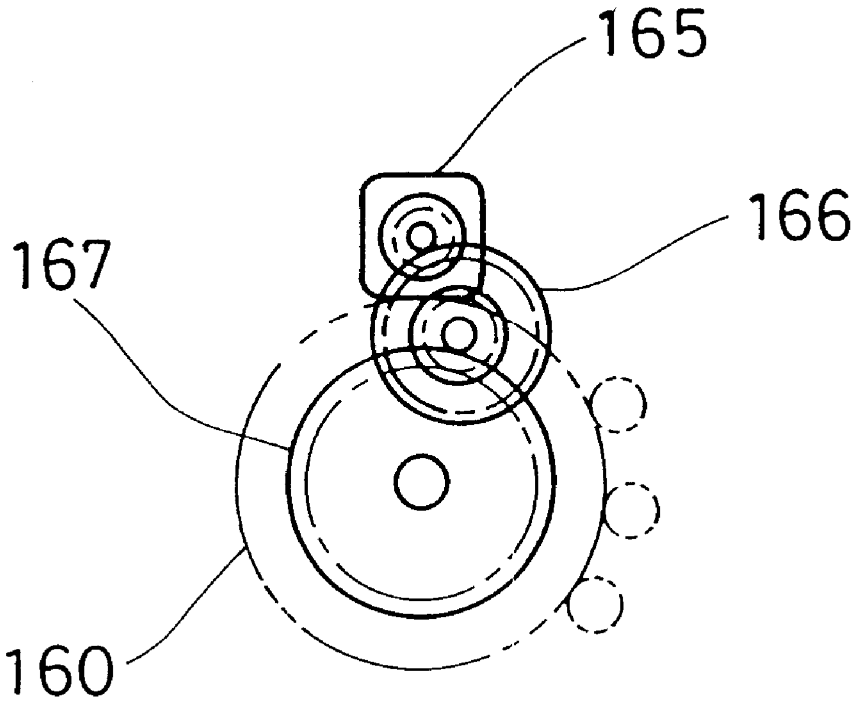
FIG. 14 is a view showing a transmission system of a driving mechanism at an apparatus main body side, which drives a photosensitive drum of the color image forming apparatus in the third embodiment according to the present invention.

FIG. 13 is a cross-sectional view showing an overall configuration of a color image forming apparatus in a third embodiment according to the present invention; and FIG. 14 is a view showing a transmission system of a driving mechanism at an apparatus main body side, which drives a photosensitive drum of the color image forming apparatus in the third embodiment according to the present invention.

In FIG. 13, numeral 160 denotes a photosensitive drum, and 161 denotes a charger for uniformly charging the surface of the photosensitive drum 160 rotating in the arrow direction. Text (not shown) mounted on a platen glass 162 is read by an image reading device 163, and an image data of the text read by the image reading device 163 is fed to the laser exposure device 164 after being subjected to image processing. The photosensitive drum 160 is irradiated with the image beam generated from the laser exposure device 164 and modulated based on the image data of the text. By using this image beam, an electrostatic latent image is formed on the surface of the photosensitive drum 160 that is uniformly charged by a charger 161.

As shown in FIG. 14, the photosensitive drum 160 is rotated in the arrow direction by rotating the photosensitive drum driving gear 167 by the rotation of a motor 165 via an idler gear 166

As shown in FIG. 13, outside the photosensitive drum 160 is provided with, along the rotation direction thereof, three developing units 168Y, 168M and 168C, which respectively contain the toner of yellow (Y), magenta (M), and cyan (C), and which develop the electrostatic latent images; a transfer device 170 for transferring the toner image onto the recording paper fed from the feed device 169; a separator 171 for separating the recording paper on which the toner image is transferred from the photosensitive drum 160; and a cleaning device 172 for removing the toner remaining on the surface of the photosensitive drum 160. Furthermore, numeral 173 denotes a fixing roller for fixing the toner image on the recording paper; and 174 denotes a conveying means for conveying the recording paper separated from the photosensitive drum 160 to the fixing roller 173. Herein, the developing unit moving means including CPU etc. (not shown) switches the developing unit 168Y, 168M and 168C by selectively moving them between an image forming position and other positions.

First, the electrostatic latent image formed on the photosensitive drum 160 is developed by a developing unit 168M for magenta (M) and thus a magenta toner image is formed on the surface of the photosensitive drum 160. Then, the electrostatic latent images are developed sequentially by the developing unit 168C for cyan (C) and the developing unit 168Y for yellow (Y). Finally, the color toner image in which the toner image of each color is overlapped is formed on the photosensitive drum 160.

The thus formed color image (toner image) is transferred onto the recording paper fed from the feed device 169 by the transfer device 170. The recording paper on which the color image (toner image) is transferred is separated from the photosensitive drum 160 by the separator 171, and then conveyed to the fixing roller 173 by the conveying means 174 and fixed, and then ejected out of the apparatus.

In the color image forming apparatus of this embodiment, in the three developments and transfer by the toner of magenta (M), cyan (C) and yellow (Y) for forming one sheet of color image, the development and transfer of the toner of the last color, yellow is performed at a different speed from that of the toners of the other colors. Furthermore, the fixation is performed at the same speed as that of the development and transfer of the toner of the last color, yellow. Consequently, in the configuration of this embodiment, the same effect can be obtained as in the first embodiment.

Furthermore, in the color image forming apparatus of this embodiment, the following expression is satisfied:

$$L4<Lp, L5<Lp,$$

wherein L4 denotes a distance, along the circumference of the photosensitive drum 160, between a developing position where color image (toner image) is formed on the photosensitive drum 160 and a transfer position (the position of the transfer device 170) where the color image (toner image) is transferred onto the recording paper, L5 denotes a distance along the conveying path of the recording paper between the transfer position and the fixing position (the position of the fixing roller 173), and Lp denotes a length of the recording paper in the conveying direction. Consequently, it is possible to make the overall configuration of the apparatus a compact size.

Furthermore, in this embodiment, the color image forming apparatus includes three developing units 168Y, 168M and 168C for developing the electrostatic latent images, and the last color in the development onto the photosensitive drum 160 is yellow. However, there is no necessary limitation to this configuration. The color image forming apparatus further including the developing unit for black, or the color image forming apparatus including five developing units also can be used. In this case, as long as the last color in the development onto the photosensitive drum is yellow or black, even if the color misalignment is somewhat increased due to the difference in the image forming speed, it is less remarkable than the color misalignment of the magenta and cyan.

Fourth Embodiment

The configuration of the color image forming apparatus of this embodiment is the same as in the first embodiment (see FIGS. 1 to 7).

In this embodiment, after the last toner image of black is transferred onto the intermediate transfer belt 50 and before the top of the image reaches the position of the secondary transfer roller 9, the secondary transfer roller 9 is brought into contact with the intermediate transfer belt 50 and the recording paper fed from the paper feed unit 12 is sandwiched and conveyed between the secondary transfer roller 9 and intermediate transfer belt 50. Thereby, the toner images of four colors on the intermediate transfer belt 50 are transferred onto the recording paper together.

Furthermore, in the formation of the color image, the time required for the operation of rotating the carriage 2, 90° is set to be about 0.7 seconds; the time required for attaching/detaching operation of coupling of output axis 70 is set to be about 0.3 seconds; and process speed is set to be about 100 mm/second.

The following is a description of the operation of successively outputting a plurality of color images in this embodiment.

Figure 15A:
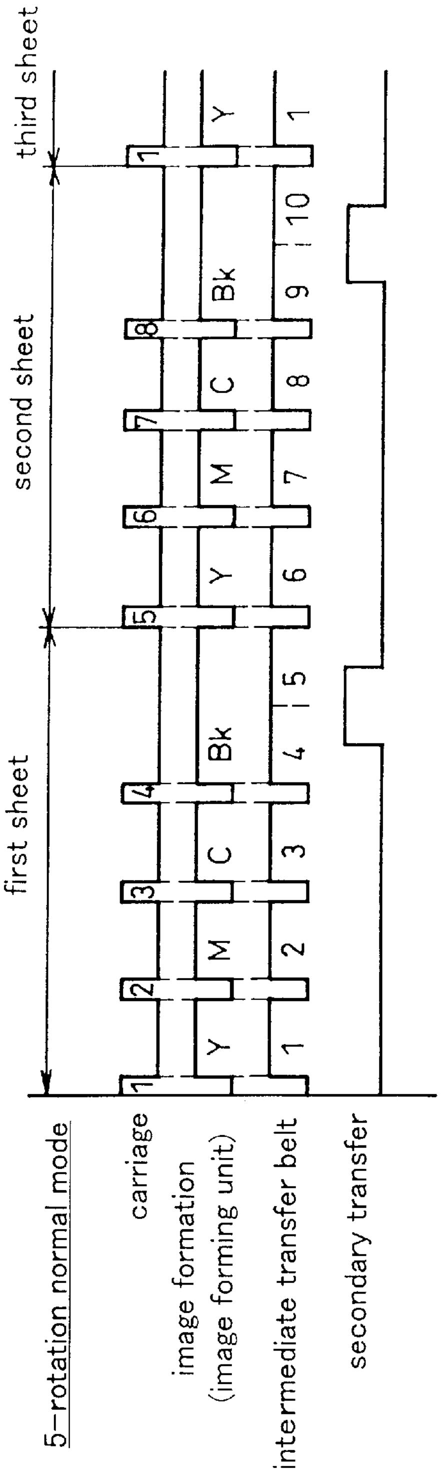
FIGS. 15A–B are time charts of a normal mode and a high speed mode in a case where an intermediate transfer belt is allowed to make 5 rotations to form one sheet of color image of a color image forming apparatus in a fourth embodiment according to the present invention.
Figure 15B:
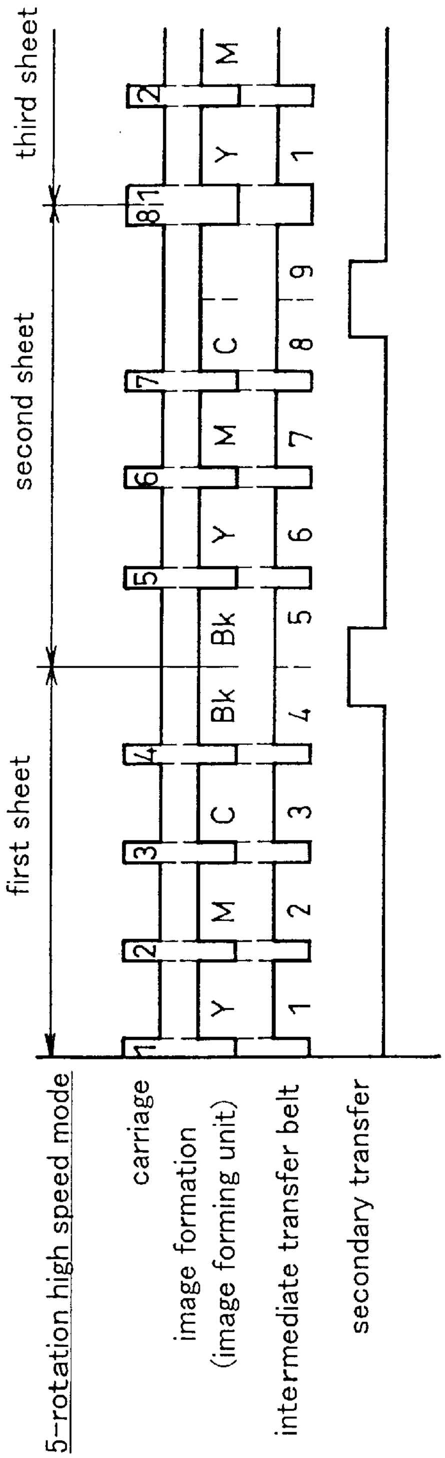

FIGS. 15A–B are time charts of a normal mode and a high speed mode in a case where an intermediate transfer belt is allowed to make 5 rotations to form one sheet of color image.

<5 Rotations Normal Mode>

The operation of successively outputting a plurality of color images by using 5 rotations normal mode is basically the repetition of outputting of one sheet of color image. As shown in FIG. 15A, the order of overlapping the toner images of many colors onto the intermediate transfer belt 50 is the same every time. The order is yellow (Y)—magenta (M)—cyan (C)—black (Bk). When the formation of toner image of each color is completed, the operation of the developing units 3 (photosensitive member 30, developing device 35, etc.) and the intermediate transfer belt 50 stops. The carriage 2 is rotated 90° and the developing unit 3 located at the image forming position 10 is switched.

Moreover, in the formation of the toner image of each color, if, for example, the charge potential of the surface of the photosensitive member 30 to be −500V (constant) and the exposure potential of the photosensitive member 30 is −50V, the thickness of toner image formed on the photosensitive member 30 becomes constant corresponding to the constant potential 120V when the developing bias is −170V (constant).

When the top of the image on the intermediate transfer belt 50 on which the last toner image of black is transferred reaches the secondary transfer position, the secondary transfer roller 9 pushes the recording paper onto the intermediate transfer belt 50. Thus, the secondary transfer of the toner image onto the recording paper starts. At this time, the image forming process on the photosensitive member 30 is continued. The primary transfer from the photosensitive member 30 onto the intermediate transfer belt 50 and the secondary transfer from the intermediate transfer belt 50 onto the recording paper simultaneously proceed.

Even if the primary transfer of the black toner image from the photosensitive member 30 onto the intermediate transfer belt 50 is completed, the secondary transfer from the intermediate transfer belt 50 onto the recording paper is still continued. Therefore, the photosensitive member 30 and the intermediate transfer belt 50 continue to be rotated. Namely, the intermediate transfer belt 50 starts to make a fifth rotation. At this time, the photosensitive member 30 is not irradiated with the laser beam 8, and the photosensitive member 30 and the developing device 35 are in a so-called idling state.

Also after the end of the image on the intermediate transfer belt 50 passes through the secondary transfer position and the secondary transfer is completed, the photosensitive member 30 and the intermediate transfer belt 50 continue to rotate. They stop when the intermediate transfer belt 50 makes 5 rotations in total and returns to the initial position. Overall, when printing one sheet of color image, the carriage 2 is rotated 90° in each of four times, and the intermediate transfer belt 50 is rotated 5 times.

Thereafter, the coupling and detent of the photosensitive member 30 and the apparatus main body are released, carriage 2 is rotated 90° and the image formation is started again from yellow sequentially.

By repeating the above-mentioned operations, a plurality of color images are output successively. In this 5 rotations normal mode, in order to output one sheet of color image, four times of the time required for the operation of rotating the carriage 2, 90° and coupling of the photosensitive member 30, etc., is necessary. Furthermore, the time is required for allowing the intermediate transfer belt 50 to rotate 5 times.

Therefore, for example, when the time required for the operation of switching the developing unit 3 by rotating the carriage 2, 90° and coupling of the photosensitive member 30, etc., is 1.0 second; the image forming speed (process speed) is 100 mm/second, and the peripheral length of the intermediate transfer belt 50 is 377 mm, the time for outputting one sheet of color image is expressed by:

$$T'=1.0\times4+(377/100)\times5=22.9 \text{ seconds.}$$

<5 Rotations High Speed Mode>

As shown in FIG. 15(*b*), in the case of outputting a plurality of color images successively by using 5 rotations high speed mode, the order of overlapping the toner images of many colors onto the intermediate transfer belt 50 is not the same every time. The first sheet begins with yellow (Y) and ends in black (Bk); the second sheet begins with black (Bk) and ends in cyan (C); and the third sheet begins with yellow (Y) and ends in black (Bk). Namely, in the normal mode, the carriage is rotated 90° so as to move the developing unit 3Y for yellow (Y) to the image forming position 10 every time. In the high speed mode, however, when the second sheet of color image is formed, the first toner image is formed by using the developing unit 3Bk for black (Bk), which is the last color used for the formation of the first sheet of color image; when the third sheet of color image is formed, the first toner image is formed by using the developing unit 3Y for yellow (Y), which is the first color used for the formation of the first sheet of color image.

In the high speed mode, after the primary transfer of the toner image of the last color (black) of the first sheet of color image is completed, when the head position of the fifth rotation of the intermediate transfer belt 50 is detected, a laser exposure device 6 starts to irradiate the photosensitive member 30 with laser beam 8 corresponding to the image data of the black toner image of the second sheet of color image. The process element of the developing device 35, etc. continue to operate, and the black toner image of the second sheet of color image is transferred onto the intermediate transfer belt 50.

At this time, the secondary transfer of the first sheet of color image continues until the end of the image on the intermediate transfer belt 50 passes through the secondary transfer position. Furthermore, the cleaning operation is continued until the end of the image on the intermediate transfer belt 50 passes through the cleaning position and these operations are performed simultaneously in parallel. As shown in FIG. 15(*b*), the primary transfer of the toner image of the last color, black of the first sheet of color image and the primary transfer of the toner image of the first color, black of the second sheet of color image are performed successively. During this time, the secondary transfer of the first sheet of color image is performed in parallel.

When the primary transfer of the black toner image of second sheet is completed, the first motor 95 stops and the photosensitive member 30 and the intermediate transfer belt 50 stop. Subsequently, the coupling and detent of the photosensitive member 30 and the apparatus main body are released, and the carriage 2 is rotated 90° and the developing units are switched. Thereby, the developing unit 3Y for yellow (Y) is positioned at the image forming position 10 and the formation of the yellow (Y) toner image and the primary transfer onto the intermediate transfer belt 50 are performed.

Similarly, with respect to magenta (M) and cyan (C), the formation of the toner image and the primary transfer onto the intermediate transfer belt 50 are performed. Thus, the color image of four colors is formed on the intermediate transfer belt 50.

When the top of the image on the intermediate transfer belt 50 on which the toner image of the last color (cyan) of the second sheet is transferred reaches the secondary transfer position, the secondary transfer roller 9 pushes the recording paper onto the intermediate transfer belt 50. Thus, the secondary transfer of the toner image onto the recording paper starts. At this time, the image forming process on the photosensitive member 30 is continued. The primary transfer from the photosensitive member 30 onto the intermediate transfer belt 50 and the secondary transfer from the intermediate transfer belt 50 onto the recording paper simultaneously proceed.

Even if the primary transfer of the cyan toner image from the photosensitive member 30 onto the intermediate transfer belt 50 is completed, the secondary transfer from the intermediate transfer belt 50 onto the recording paper still is continued. Therefore, the photosensitive member 30 and the intermediate transfer belt 50 continue to be rotated. Namely, the intermediate transfer belt 50 starts to make a ninth rotation. At this time, the photosensitive member 30 is not irradiated with the laser beam 8, and the photosensitive member 30 and the developing device 35 are in a so-called idling state.

Also after the end of the image on the intermediate transfer belt 50 passes through the secondary transfer position and the secondary transfer is completed, the photosensitive member 30 and the intermediate transfer belt 50 continue to rotate. They stop when the rotation of the intermediate transfer belt 50 makes nine rotations in total and returns to the initial position. Subsequently, the coupling and detent of the photosensitive member 30 and the apparatus main body are released, the carriage 2 is rotated and the developing units are switched. Consequently, the developing unit 3Y for yellow (Y) is positioned at the image forming position 10. Then, the formation of yellow (Y) toner image and the primary transfer onto the intermediate transfer belt 50 are performed in order to form the third sheet of the color image.

Similarly, with respect to magenta (M), cyan (C) and black (Bk), the formation of the toner images and the primary transfer onto the intermediate transfer belt 50 are performed.

As mentioned above, in the first sheet, the color image is formed on the intermediate transfer belt 50 in the order of Y (yellow)—M (magenta)—C (cyan)—Bk (black); in the second sheet, the color image is formed on the intermediate transfer belt 50 in the order of Bk—Y—M—C; and in the third sheet, the color image is formed on the intermediate transfer belt 50 in the order of Y—M—C—Bk. Afterwards, similarly, a plurality of color images are output while varying the color order, that is, Bk—Y—M—C, Y—M—C—Bk, Bk—Y—M—C . . .

In this 5 rotations high speed mode, in order to output two sheets of color images, eight times of the time required for the operation of rotating 90° the carriage 2 and coupling of the photosensitive member 30, etc., is necessary. Furthermore, the time is required for allowing the intermediate transfer belt 50 to rotate 9 times.

Therefore, for example, when the time required for the operation of switching the developing units 3 by rotating the carriage 2, 90° and coupling of the photosensitive member 30, etc., is 1.0 second, the image forming speed (process speed) is 100 mm/second, and the peripheral length of the intermediate transfer belt 50 is 377 mm; the time for outputting one sheet of color image is expressed by:

$$T=\{1.0\times8+(377/100)\times9\}/2=21 \text{ seconds.}$$

Consequently, as compared with the above-mentioned 5 rotations normal mode, the output time per sheet can be reduced by 1.9 seconds. Thus, when the plurality of color images are output successively, the speed becomes faster.

Figure 16A:
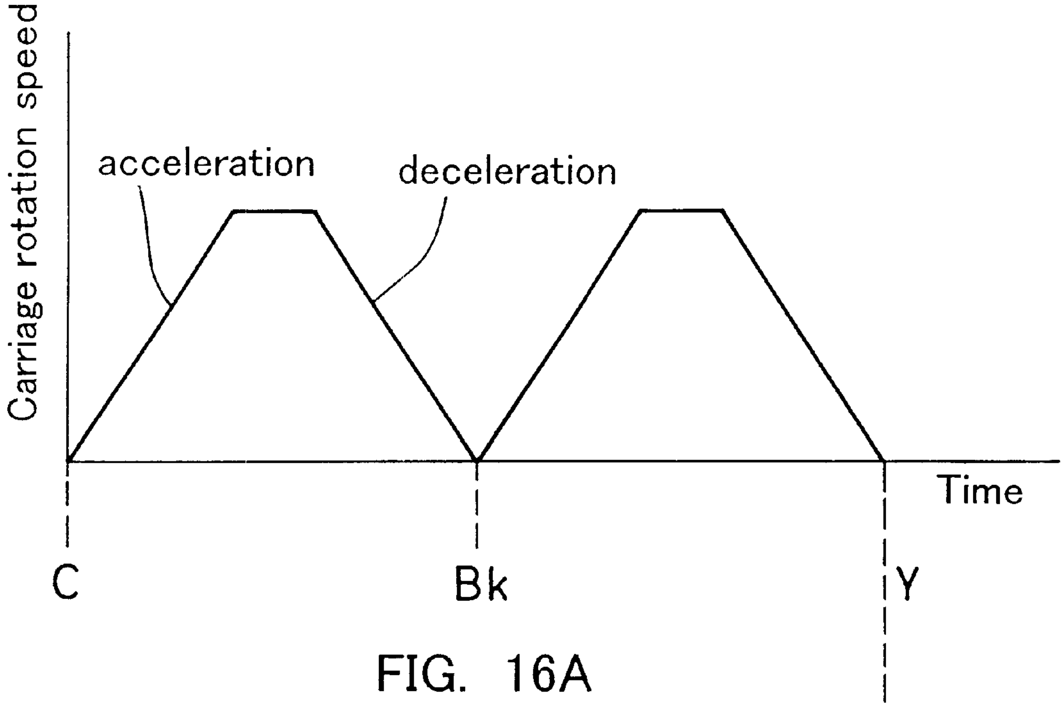
FIGS. 16A–B are graphs showing a speed-time relationship of a developing unit moving means between the second sheet and the third sheet in a case where an intermediate transfer belt is allowed to make 5 rotations to form one sheet of color image of the color image forming apparatus in a fourth embodiment according to the present invention.
Figure 16B:
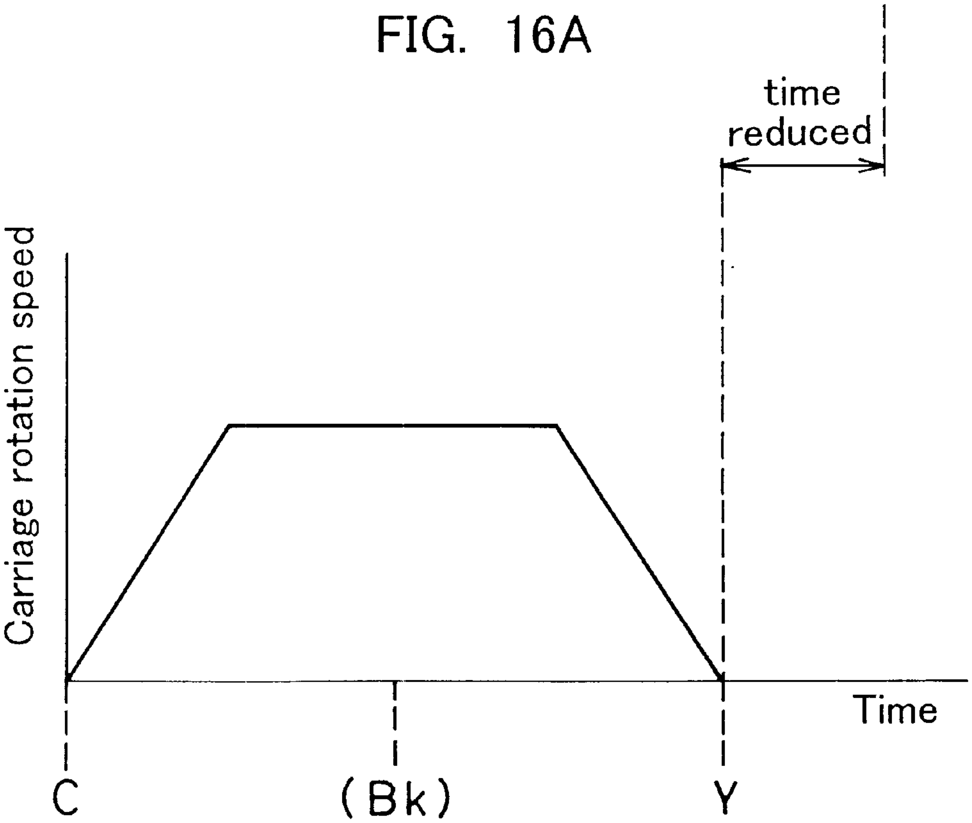

Furthermore, in order to perform the primary transfer of the toner image of the first color (yellow) of the third sheet of color image, when the developing unit 3 at the image forming position 10 is switched from the developing unit 3C for cyan to the developing unit 3Y for yellow, by moving the developing unit 3Y for yellow to the image forming position 10 without temporarily stopping the developing unit 3B for black, it is possible to reduce the printing time further. FIG. 16 show this state. As shown in FIG. 16, as compared with the case where the rotation speed of the carriage 2 is reduced temporarily and the developing unit 3Bk for black is allowed to stop at the image forming position 10, the switching time of the developing unit 3 is reduced.

Furthermore, in this 5 rotations high speed mode, the order of overlapping the toner images in the first sheet (or third sheet) of color image and the second sheet of color image are different only in that the black toner image is transferred first or overlapped last and the order of overlapping the toner images of yellow, magenta and cyan is the same. Therefore, no color misalignment occurs.

Moreover, in general, when the printing is completed, the apparatus is in a standing state with the developing unit remaining located at the image forming position as it is. However, in the standing state, when the developing unit 3Bk for black is allowed to be positioned at the image forming position 10, it is possible to reduce the printing time of the first sheet of image in the case of printing the frequently used monochromatic image. Furthermore, when the color image is printed, it is always possible to start to print usually in the same sequence. Furthermore, the printing time of the first sheet of image is not changed depending upon the state in which the previous printing is completed.

Figure 17A:
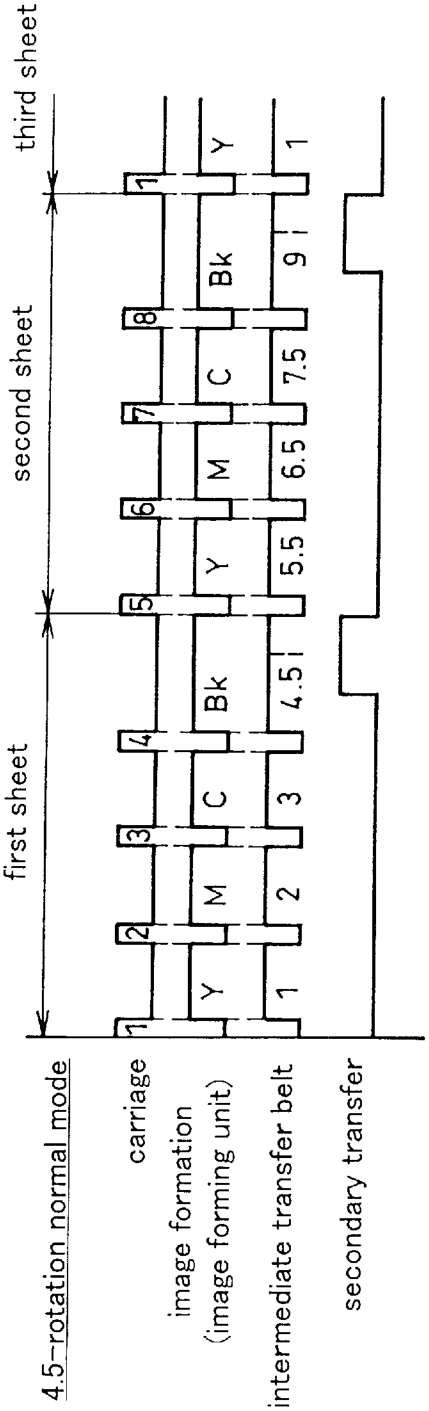
FIGS. 17A–B are time charts of a normal mode and a high speed mode in a case where an intermediate transfer belt is allowed to make 4.5 rotations to form one sheet of color image of the color image forming apparatus in the fourth embodiment according to the present invention.
Figure 17B:
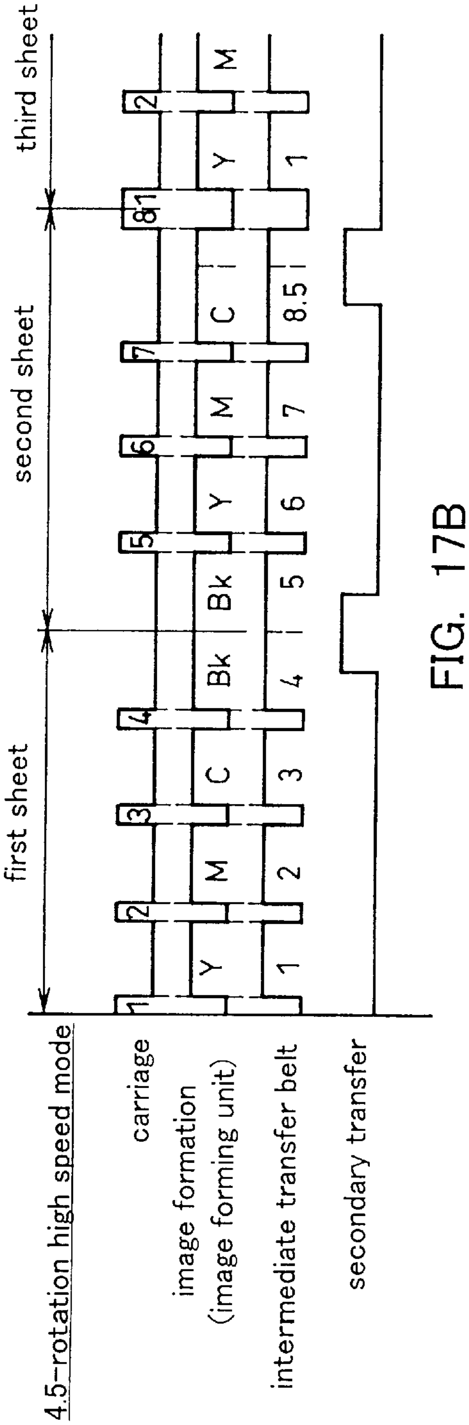

FIG. 17 is a time chart of a normal mode and a high speed mode in a case where an intermediate transfer belt is allowed to make 4.5 rotations to form one sheet of color image.

<4.5 Rotations Normal Mode>

Also in the 4.5 rotations normal mode, as shown in FIG. 17(*a*), the order of overlapping the toner images of many colors onto the intermediate transfer belt 50 is the same every time. The order is yellow (Y)—magenta (M)—cyan (C)—black (Bk). When the formation of the toner image of each color is completed, the operations of the developing units 3 (photosensitive member 30, developing device 35, etc.) and the intermediate transfer belt 50 stop. The carriage 2 is rotated 90° and the developing unit 3 located at the image forming position 10 is switched.

When the top of the image on the intermediate transfer belt 50 on which the last toner image of black is transferred reaches the secondary transfer position, the secondary transfer roller 9 pushes the recording paper onto the intermediate transfer belt 50. Thus, the secondary transfer of the toner image onto the recording paper starts. At this time, the image forming process on the photosensitive member 30 is continued. The primary transfer from the photosensitive member 30 onto the intermediate transfer belt 50 and the secondary transfer from the intermediate transfer belt 50 onto the recording paper simultaneously proceed.

When the intermediate transfer belt 50 is rotated four times in total, the primary transfer of the black toner image from the photosensitive member 30 onto the intermediate transfer belt 50 is completed. However, since the secondary transfer from the intermediate transfer belt 50 onto the recording paper still is continued, the photosensitive member 30 and the intermediate transfer belt 50 continue to be rotated. At this time, the photosensitive member 30 is not irradiated with the laser beam 8, and the photosensitive member 30 and the developing device 35 are in a so-called idling state.

After the end of the image on the intermediate transfer belt 50 passes through the secondary transfer position and the secondary transfer is completed, the photosensitive member 30 and the intermediate transfer belt 50 stop when the intermediate transfer belt 50 is rotated 4.5 times in total. Overall, when printing one sheet of color image, the carriage 2 is rotated 90° four times, and the intermediate transfer belt 50 is rotated 4.5 times.

Thereafter, the coupling and detent of the photosensitive member 30 and the apparatus main body are released, carriage 2 is rotated 90° and the image formation starts from yellow sequentially.

By repeating the above-mentioned operations, a plurality of color images are output successively. In this 4.5 rotations normal mode, in order to output one sheet of color image, four times of the time required for the operation of rotating the carriage 2, 90° and coupling of the photosensitive member 30, etc., is necessary. Furthermore, the time is required for allowing the intermediate transfer belt 50 to rotate 4.5 times.

Therefore, for example, when the time required for the operation of switching the developing unit 3 by rotating the carriage 2, 90° and coupling of the photosensitive member 30, etc., is 1.0 second, the image forming speed (process speed) is 100 mm/second, and the peripheral length of the intermediate transfer belt 50 is 377 mm, the time for outputting one sheet of color image is expressed by:

$$T'=1.0\times4+(377/100)\times4.5=21 \text{ seconds.}$$

<4.5 Rotations High Speed Mode>

As shown in FIG. 17(*b*), in the case of outputting a plurality of color images successively by using 4.5 rotations high speed mode, the order of overlapping the toner images of many colors onto the intermediate transfer belt 50 is not the same every time. The first sheet begins with yellow (Y) and ends in black (Bk); the second sheet begins with black (Bk) and ends in cyan (C); and the third sheet begins with yellow (Y) and ends in black (Bk), again.

Namely, in the 4.5 rotations normal mode, the carriage is rotated 90° so as to move the developing unit 3Y for yellow (Y) to the image forming position 10 every time. However, in the 4.5 rotations high speed mode, when the second sheet of color image is formed, the first toner image is formed by using the developing unit 3Bk for black (Bk), which is the last color used for the formation of the first sheet of color image; when the third sheet of color image is formed, the first toner image is formed by using the developing unit 3Y for yellow (Y), which is the first color used for the formation of the first sheet of color image.

In the 4.5 rotations high speed mode, after the primary transfer of the toner image of the last color (black) of the first sheet of color image is completed, when the head position of the fifth rotation of the intermediate transfer belt 50 is detected, a laser exposure device 6 starts to irradiate the photosensitive member 30 with laser beam 8 corresponding to the image data of the black toner image of the second sheet of color image. The process elements of the developing device 35, etc. continue to operate, and the black toner image of the second sheet of color image is transferred onto the intermediate transfer belt 50.

At this time, the secondary transfer of the first sheet of color image continues until the end of the image on the intermediate transfer belt 50 passes through the secondary transfer position. Furthermore, the cleaning operation is continued until the end of the image on the intermediate transfer belt 50 passes through the cleaning position and these operations are performed simultaneously in parallel. As shown in FIG. 17(*b*), the primary transfer of the toner image of the last color, black of the first sheet of color image and the primary transfer of the toner image of the first color, black of the second sheet of color image are performed successively. During this time, the secondary transfer of the first sheet of color image is performed in parallel.

When the primary transfer of the black toner image of second sheet of color image is completed, the first motor 95 stops and the photosensitive member 30 and the intermediate transfer belt 50 stop. Subsequently, the coupling and detent of the photosensitive member 30 and the apparatus main body are released, and the carriage 2 is rotated 90° and the developing units are switched. Thereby, the developing unit 3Y for yellow (Y) is positioned at the image forming position 10 and the formation of the yellow toner image and the primary transfer onto the intermediate transfer belt 50 of the yellow toner image are performed.

Similarly, with respect to magenta (M) and cyan (C), the formation of the toner image and the primary transfer onto the intermediate transfer belt 50 are performed. Thus, the second sheet of the color image of four colors is formed on the intermediate transfer belt 50.

When the intermediate transfer belt 50 is rotated 8 times in total, the primary transfer of the cyan toner image from the photosensitive member 30 onto the intermediate transfer belt 50 is completed. On the other hand, since the secondary transfer from the intermediate transfer belt 50 onto the recording paper is still continued, the photosensitive member 30 and the intermediate transfer belt 50 continue to be rotated. At this time, the photosensitive member 30 is not irradiated with the laser beam 8, and the photosensitive member 30 and the developing device 35 are in a so-called idling state.

After the end of the image on the intermediate transfer belt 50 passes through the secondary transfer position and the secondary transfer is completed, the photosensitive member 30 and the intermediate transfer belt 50 stop when the intermediate transfer belt 50 is rotated 8.5 times in total. Subsequently, the coupling and detent of the photosensitive member 30 and the apparatus main body are released, the carriage 2 is rotated and the developing units are switched. Therefore, the developing unit 3Y for yellow (Y) is positioned at the image forming position 10. Then, the formation of yellow (Y) toner image and the primary transfer onto the intermediate transfer belt 50 are performed in order to form the third sheet of color image.

Similarly, with respect to magenta (M), cyan (C) and black (Bk), the formation of toner image and the primary transfer onto the intermediate transfer belt 50 are performed. Thus, the color image of four colors is formed on the intermediate transfer belt.

As mentioned above, in the first sheet, the color image is formed on the intermediate transfer belt 50 in the order of Y (yellow)—M (magenta)—C (cyan)—Bk (black); in the second sheet, the color image is formed on the intermediate transfer belt 50 in the order of Bk—Y—M—C; and in the third sheet, the color image is formed on the intermediate transfer belt 50 in the order of Y—M—C—Bk. Afterward, similarly, a plurality of color images are output while varying the order of overlapping the toner images of many colors, i.e., Bk—Y—M—C, Y—M—C—Bk, Bk—Y—M—C . . .

In this 4.5 rotations high speed mode, in order to output two sheets of color images, eight times of the time required for the operation of rotating the carriage 2, 90° and coupling of the photosensitive member 30 etc. is necessary. Furthermore, the time is required for allowing the intermediate transfer belt 50 to rotate 8.5 times.

Therefore, for example, when the time required for the operation of switching the developing unit 3 by rotating the carriage 2, 90° and coupling of the photosensitive member 30, etc. is 1.0 second, the image forming speed (process speed) is 100 mm/second, and the peripheral length of the intermediate transfer belt 50 is 377 mm, the time for outputting one sheet of color image is expressed by:

$$T=\{1.0\times 8+(377/100)\times 8.5\}/2=20 \text{ seconds.}$$

As a result, as compared with the above-mentioned normal mode, the output time per sheet can be reduced by 1 second. Thus, when the plurality of color images are output successively, the speed becomes faster.

The color image forming apparatus of the present invention has a three-color mode for forming one sheet of color image by using three colors of yellow, magenta, and cyan, in addition to the four-color mode for forming one sheet of color image by using four colors of yellow, magenta, cyan and black. By using the modified high speed mode in this three-color mode, further high speed output is possible.

Figure 18A:
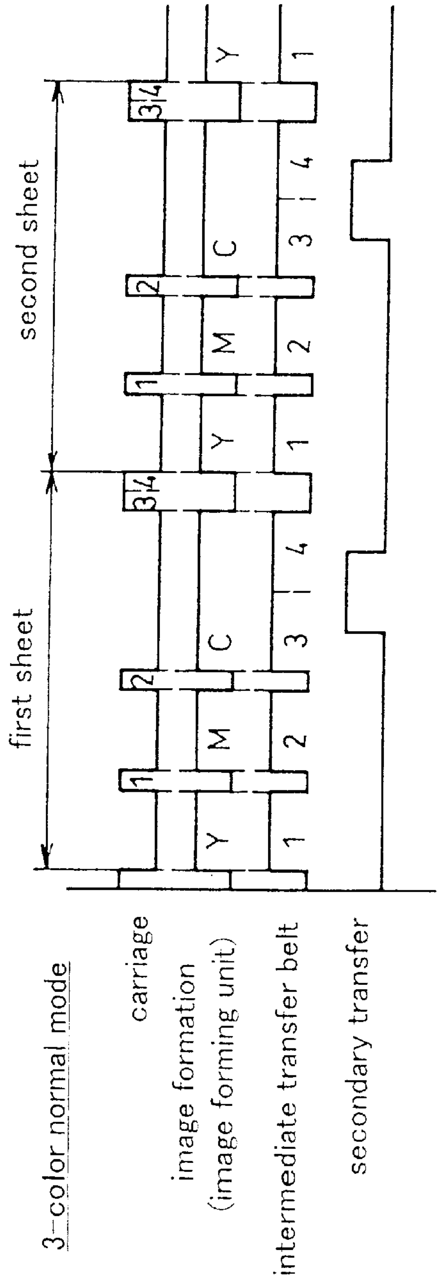
FIGS. 18A–B are time charts of a normal mode and a high speed mode in a case where one sheet of color image is formed by the use of three colors of yellow, magenta and cyan of the color image forming apparatus in a fourth embodiment according to the present invention.
Figure 18B:
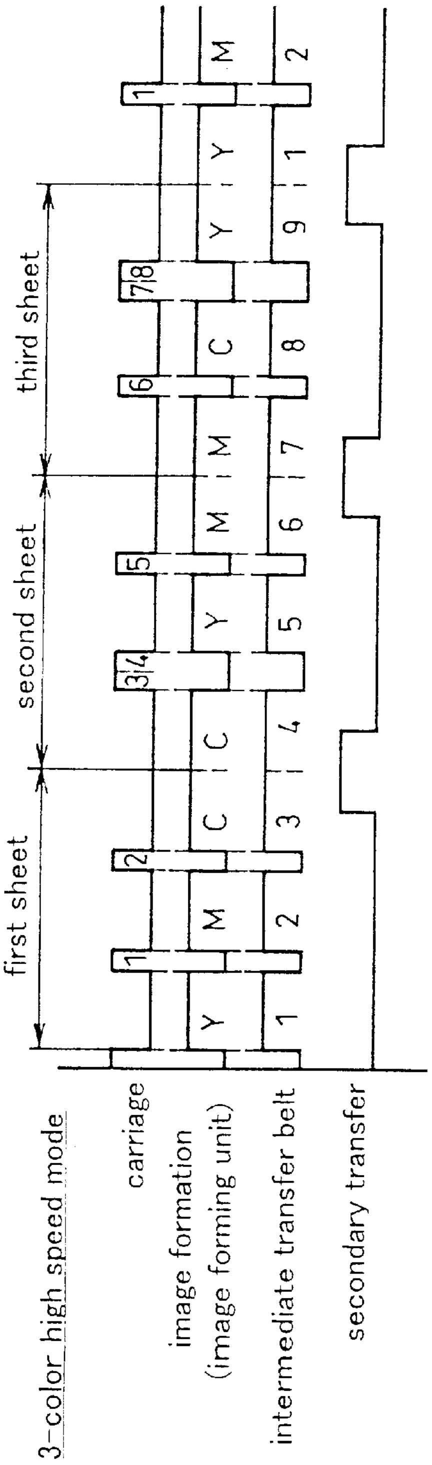
Figure 19:
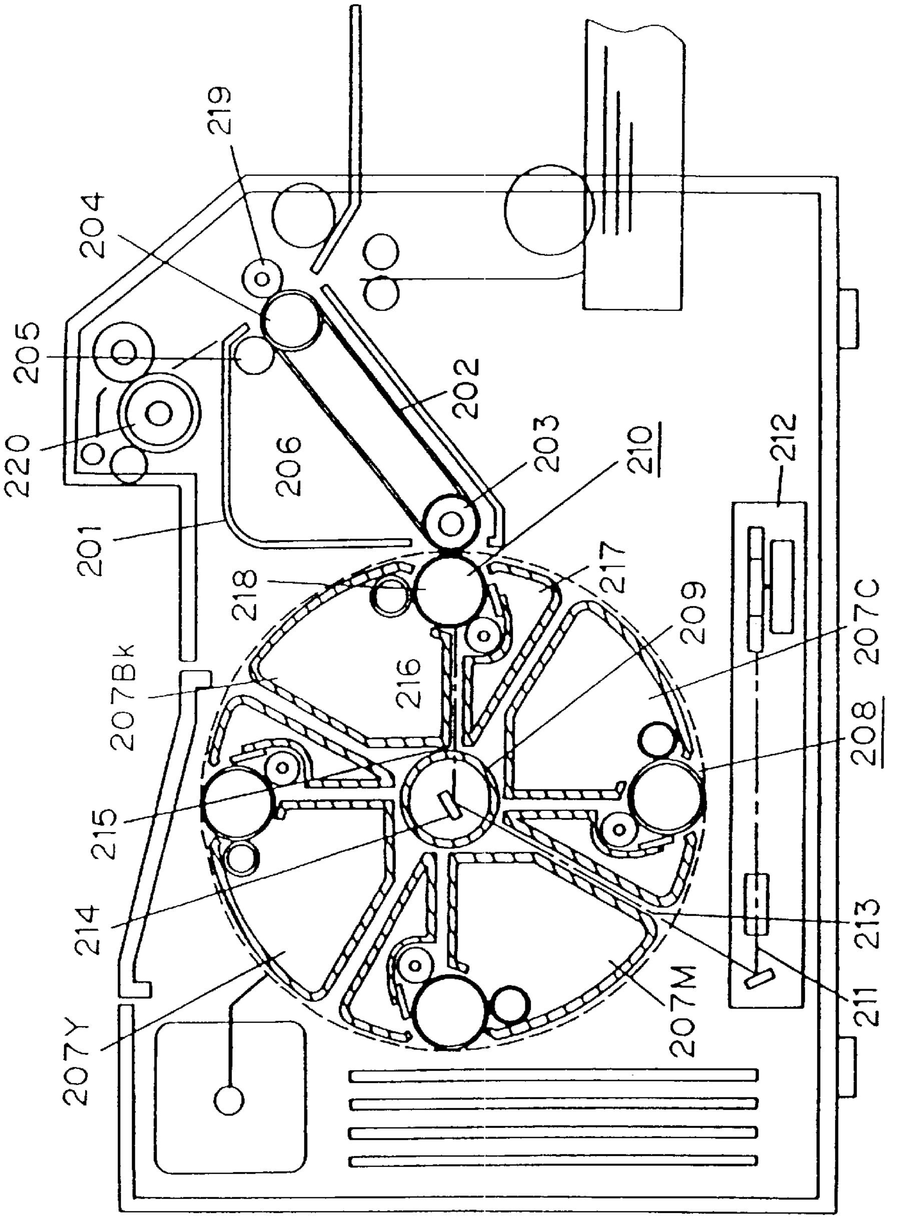
FIG. 19 (PRIOR ART)
FIG. 19 is a cross-sectional view showing an overall configuration of a conventional color image forming apparatus.
Figure 20:
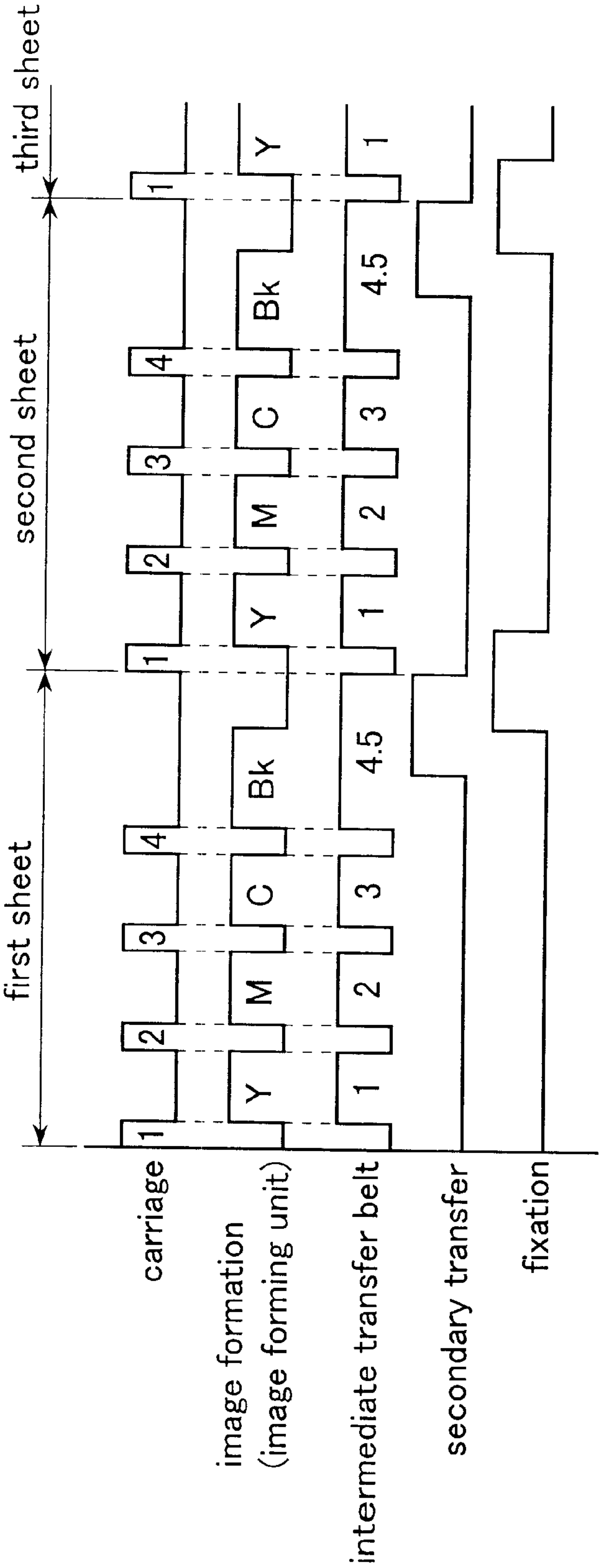
FIG. 20 (PRIOR ART)
FIG. 20 is a time chart showing an image forming operation of a conventional color image forming apparatus.
Figure 21A:
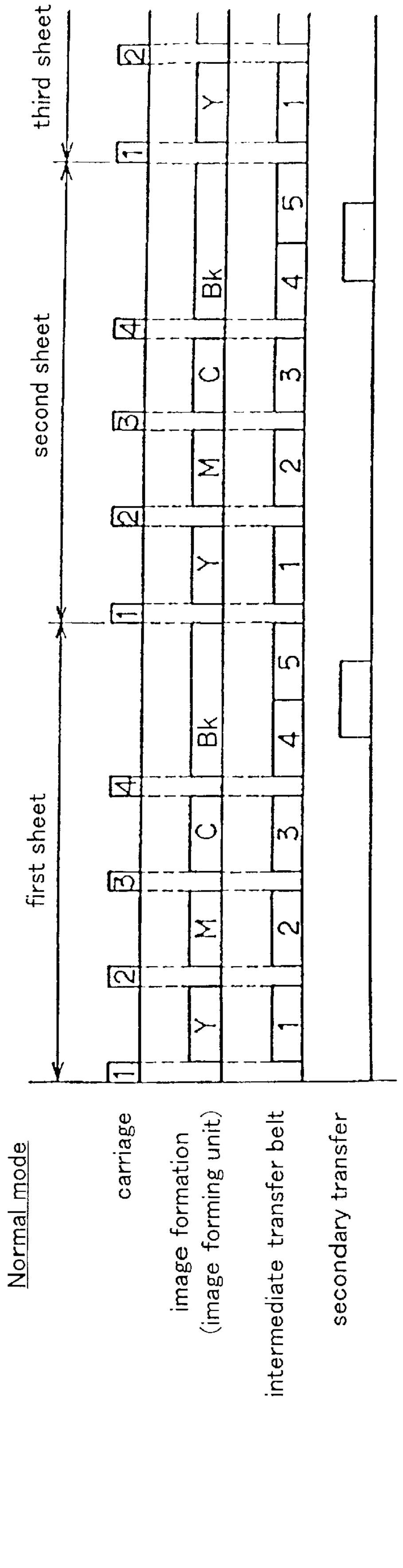
FIG. 21A (PRIOR ART)
FIGS. 21A–B are time charts of a normal mode and a high speed mode of a conventional color image forming apparatus.
Figure 21B:
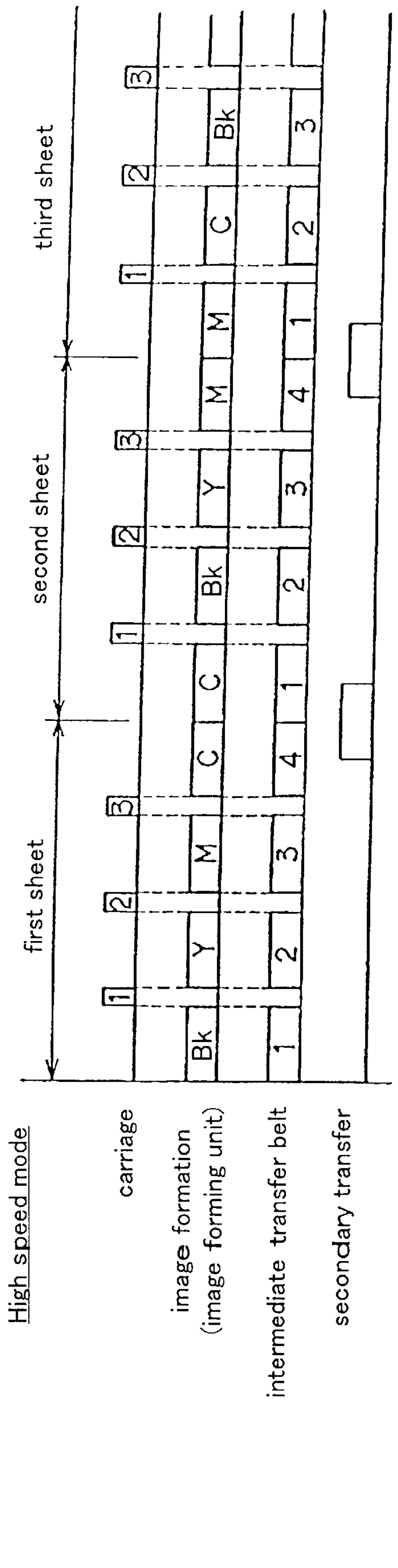
FIG. 21B (PRIOR ART)

FIG. 18 is a time chart of a normal mode and a high speed mode in a case where one sheet of color image is formed by the use of three colors of yellow, magenta and cyan of the color image forming apparatus in the fourth embodiment according to the present invention.

<Three-color Normal Mode>

In outputting a plurality of color images successively by using three-color normal mode, as shown in FIG. 18(*a*), the order of overlapping the toner images of many colors onto the intermediate transfer belt 50 is the same every time. The order is yellow (Y)—magenta (M)—cyan (C). When the formation of the toner image of each color is completed, the operations of developing units 3 (photosensitive member 30, developing device 35, etc.) and intermediate transfer belt 50 stop. The carriage 2 is rotated 90° and the developing unit 3 located at the image forming position 10 is switched.

When the top of the image on the intermediate transfer belt 50 on which the last toner image of cyan is transferred reaches the secondary transfer position, the secondary transfer roller 9 pushes the recording paper onto the intermediate transfer belt 50. Thus, the secondary transfer of the toner image onto the recording paper starts. At this time, the image forming process on the photosensitive member 30 is continued. The primary transfer from the photosensitive member 30 onto the intermediate transfer belt 50 and the secondary transfer from the intermediate transfer belt 50 onto the recording paper simultaneously proceed.

Even if the primary transfer of the cyan toner image from the photosensitive member 30 onto the intermediate transfer belt 50 is completed, the secondary transfer from the intermediate transfer belt 50 onto the recording paper is still continued. Therefore, the photosensitive member 30 and the intermediate transfer belt 50 continue to be rotated. Namely, the intermediate transfer belt 50 starts to make a fourth rotation. At this time, the photosensitive member 30 is not irradiated with the laser beam 8, and the photosensitive member 30 and the developing device 35 are in a so-called idling state.

Also after the end of the image on the intermediate transfer belt 50 passes through the secondary transfer position and the secondary transfer is completed, the photosensitive member 30 and the intermediate transfer belt 50 continue to rotate. The rotations of the photosensitive member 30 and the intermediate transfer belt 50 stop when the intermediate transfer belt 50 is rotated four times in total and returns to the initial position.

Thereafter, the coupling and detent of the photosensitive member 30 and the apparatus main body are released, the carriage 2 is rotated 180° and the black (Bk) is skipped, and then the image formation starts from yellow sequentially. Above all, when printing one sheet of color image, the carriage 2 is rotated 90° each four times, and the intermediate transfer belt 50 is rotated four times.

By repeating the above-mentioned operations, a plurality of color images are output successively. In this three-color normal mode, in order to output one sheet of color image, four times of the time necessary for the operation of rotating the carriage 2, 90° and time for coupling of the photosensitive member 30, etc., is necessary. Furthermore, the time is required for allowing the intermediate transfer belt 50 to rotate 4 our times.

Therefore, for example, when the time required for the operation of switching the developing unit 3 by rotating the carriage 2, 90° and coupling of the photosensitive member 30, etc., is 1.0 second, the image forming speed (process speed) is 100 mm/second, and the peripheral length of the intermediate transfer belt 50 is 377 mm, the time for outputting one sheet of color image is expressed by:

$$T_3'=1.0\times 4+(377/100)\times 4=19.1 \text{ seconds.}$$

<Three-color High Speed Mode>

As shown in FIG. 18(*b*), in the case of outputting a plurality of color images successively by using three-color high speed mode, the order of overlapping the toner images of many colors onto the intermediate transfer belt 50 is not the same every time. In the first sheet, the color image is formed on the intermediate transfer belt 50 in the order of Y (yellow)—M (magenta)—C (cyan). In the second sheet, the image formation begins with cyan (C), which is the last color of the first sheet, then black (Bk) is skipped and the yellow (Y) toner image and the magenta (M) toner image are formed in this order. In the third sheet, the image formation begins with magenta (M), which is the last color of the second sheet, followed by cyan (C), then black (Bk) is skipped and the yellow (Y) toner image is formed.

In the high speed mode, after the primary transfer of the toner image of the last color (cyan) of the first sheet, when the head position of the fourth rotation of the intermediate transfer belt 50 is detected, a laser exposure device 6 starts to irradiate the photosensitive member 30 with laser beam 8 corresponding to the cyan image data of the second sheet. The process elements of the developing device 35 etc. continue to operate, and the cyan toner image of the second sheet is transferred onto the intermediate transfer belt 50.

At this time, the secondary transfer of the first sheet of color image continues until the end of the image on the intermediate transfer belt 50 passes through the secondary transfer position. Furthermore, the cleaning operation is continued until the end of the image on the intermediate transfer belt 50 passes through the cleaning position and these operations are performed simultaneously in parallel. As shown in FIG. 18(*b*), the primary transfer of the toner image of the last color, cyan of the first sheet and the primary transfer of the toner image of the first color, black of the second sheet are performed successively. During this time, the secondary transfer of the first sheet is performed in parallel.

When the primary transfer of the cyan toner image of second sheet is completed, the first motor 95 stops and the photosensitive member 30 and the intermediate transfer belt 50 stop. Subsequently, the coupling and detent of the photosensitive member 30 and the apparatus main body are released, and the carriage 2 is rotated 180° and the developing units are switched. Thereby, the developing unit 3Y for yellow (Y) is positioned at the image forming position 10 and the formation of the yellow toner image and the primary transfer onto the intermediate transfer belt 50 of the yellow toner image are performed.

Similarly, with respect to magenta (M), the formation of the toner image and the primary transfer onto the intermediate transfer belt 50 are performed. Thus, the second sheet of the color image of three colors is formed on the intermediate transfer belt 50.

After the primary transfer of the toner image of the last color (magenta) of the second sheet is completed, when the head position of the seventh rotation of the intermediate transfer belt 50 is detected, a laser exposure device 6 starts to irradiate the photosensitive member 30 with laser beam 8 corresponding to the magenta image data of the third sheet. The process elements of the developing device 35 etc. continue to operate, and the magenta toner image of the third sheet is transferred onto the intermediate transfer belt 50.

At this time, the secondary transfer of the second sheet of color image continues until the end of the image on the intermediate transfer belt 50 passes through the secondary transfer position. Furthermore, the cleaning operation is continued until the end of the image on the intermediate transfer belt 50 passes through the cleaning position and these operations are performed simultaneously in parallel. As shown in FIG. 18(*b*), the primary transfer of the toner image of the last color, magenta of the second sheet and the primary transfer of the toner image of the first color, magenta of the third sheet are performed successively. During this time, the secondary transfer of the second sheet of color image is performed in parallel.

When the primary transfer of the magenta toner image of third sheet is completed, the first motor 95 stops and the photosensitive member 30 and the intermediate transfer belt 50 stop. Subsequently, the coupling and detent of the photosensitive member 30 and the apparatus main body are released, and the carriage 2 is rotated 90° and the developing units are switched. Thereby, the developing unit 3C for cyan (C) is positioned at the image forming position 10 and the formation of the cyan (C) toner image and the primary transfer of the cyan (C) toner image onto the intermediate transfer belt 50 are performed.

When the primary-transfer of the cyan toner image of third sheet is completed, the first motor 95 stops and the photosensitive member 30 and the intermediate transfer belt 50 stop. Subsequently, the coupling and detent of the photosensitive member 30 and the apparatus main body are released, and the carriage 2 is rotated 180° and the developing units are switched.

Thereby, the developing unit 3Y for yellow (Y) is positioned at the image forming position 10 and the formation of the yellow (C) toner image and the primary transfer of the yellow (Y) toner image onto the intermediate transfer belt 50 are performed.

At this time, the secondary transfer of the color image of the third sheet continues until the end of the image on the intermediate transfer belt 50 passes through the secondary transfer position. Furthermore, the cleaning operation is continued until the end of the image on the intermediate transfer belt 50 passes through the cleaning position and these operations are simultaneously performed in parallel. As shown in FIG. 18(*b*), the primary transfer of the toner image of the last color, yellow of the third sheet and the primary transfer of the toner image of the first color, yellow of the fourth sheet are performed successively. During this time, the secondary transfer of the third sheet of color image is performed in parallel.

By repeating the above-mentioned operations, a plurality of color images are output successively. In this three-color normal mode, in order to output three sheets of color images, eight times of the time required for the operation of rotating the carriage 2, 90° and coupling of the photosensitive member 30, etc., is necessary. Furthermore, the time is required for allowing the intermediate transfer belt 50 to rotate 9 times.

Therefore, for example, when the time required for the operation of switching the developing unit 3 by rotating the carriage 2, 90° and coupling of the photosensitive member 30, etc., is 1.0 second, the image forming speed (process speed) is 100 mm/second, and the peripheral length of the intermediate transfer belt 50 is 377 mm, the time for outputting one sheet of color image is expressed by:

$$T_3=\{1.0\times8+(377/100)\times9\}/3=14 \text{ seconds.}$$

Consequently, as compared with the above-mentioned three-color normal mode, the output time per sheet can be reduced by 5.1 seconds. Thus, when the plurality of color images are output successively, the speed becomes faster.

In the color image forming apparatus of this embodiment, each of four developing units 3 is formed integrally as one unit including a photosensitive member 30 in each color of yellow, magenta, cyan, and black and the process elements provided therearound. However, there is no necessary limitation to this configuration. It is possible to employ, for example, configurations of three-color developing units or five-color developing units.

Furthermore, in this embodiment, the case where each of the plurality of developing units 3 includes the photosensitive member 30 is described, but there is no necessary limitation to this configuration. The photosensitive member 30 may be separated from the developing units 3.

Furthermore, this embodiment describes the color image forming apparatus in which the toner images of each color, which is formed on the photosensitive member 30, is overlapped on the intermediate transfer belt 50 (intermediate transfer member), and then the toner images are re-transferred onto the recording paper together. However, there is no necessary limitation to this configuration, and it is also possible to use a color image forming apparatus in which the toner images are directly transferred from the photosensitive member onto the recording paper, and then the color image is synthesized directly on the recording paper. In this case, for example, the recording paper wound around the transfer drum corresponds to the transfer member.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A color image forming apparatus, comprising a photosensitive member on the surface of which an electrostatic latent image can be formed, a plurality of developing units, each having a different color of toner and developing means, a developing unit moving means for switching the plurality of developing units by moving them selectively between an image forming position and other positions, a primary transfer means for overlapping sequentially toner images of many colors, which are formed on the photosensitive member by the plurality of developing units, thereby transferring a color image onto an intermediate transfer member, an intermediate transfer member driving means for driving the intermediate transfer member at a predetermined speed, a secondary transfer means for transferring the color image, which is primary transferred by being overlapped on the intermediate transfer member, onto a printing medium, and a fixing means for fixing the color image, which is transferred on the printing medium, to the printing medium, wherein, in several times of primary transfers of toners of a plurality of colors for forming one sheet of color image, the primary transfer of the toner of the last color is performed at a speed less than that of the toners of the other colors and more than ½ of that of the toners of the other colors.

2. The color image forming apparatus according to claim 1, wherein the following expression is satisfied:

$$L1<Lp, L2<Lp,$$

wherein L1 denotes a distance between a primary transfer position in which the primary transfer is performed onto the intermediate transfer member by the primary transfer means and a secondary transfer position in which a secondary transfer is performed onto the printing medium by the secondary transfer means, L2 denotes a distance between the secondary transfer position and a fixing position in which a fixation is performed to the printing medium by the fixing means, and Lp denotes a length of the printing medium in a conveying direction.

3. The color image forming apparatus according to claim 1, wherein the number of developing units is four, colors of the toner included in the four developing units are yellow, magenta, cyan and black, respectively, and the last color in the primary transfer is yellow or black.

4. The color image forming apparatus according to claim 1, wherein each of the plurality of developing units is formed integrally as one unit including the photosensitive member.

5. A color image forming apparatus, comprising:

a photosensitive member on the surface of which an electrostatic latent image can be formed, a plurality of developing units each having a different color of toner and developing means, a developing unit moving means for switching the plurality of developing units by moving them selectively between an image forming position and other positions, a transfer drum around which a printing medium can be wound and for overlapping sequentially toner images of many colors, which are formed on the photosensitive member, thereby transferring a color image onto the printing medium, and a fixing means for fixing the color image, which is transferred onto the printing medium, to the printing medium, wherein, in several times of transfers of toners of a plurality of colors for forming one sheet of color image, the transfer of the toner of the last color is performed at a speed less than that of the toners of the other colors and more than ½ of that of the toners of the other colors.

6. The color image forming apparatus according to claim 5, wherein the following expression is satisfied:

$$L3<Lp,$$

wherein L3 denotes a distance between a transfer position in which the color image is transferred onto the printing medium and a fixing position in which a fixation is performed to the printing medium by the fixing means, and Lp denotes a length of the printing medium in a conveying direction.

7. The color image forming apparatus according to claim 5, wherein the number of developing units is four, colors of the toner included in the four developing units are yellow, magenta, cyan and black, respectively, and the last color transferred onto the printing medium is yellow or black.

8. A color image forming apparatus, comprising:

a plurality of developing units each having a different color of toner and developing means, a developing unit moving means for switching the plurality of developing units by moving them selectively between an image forming position and other positions, a photosensitive member capable of receiving a color image formed of overlapping sequentially toner images of many colors obtained by the plurality of developing units, a transfer means for transferring the color image formed on the photosensitive member onto a printing medium, and a fixing means for fixing the color images, which is transferred onto the printing medium, to the printing medium, wherein, in the several times of developments of toners of a plurality of colors for forming one sheet of color image, the development of the toner of the last color is performed at a speed less than that of the toners of the other colors and more than ½ of that of the toners of the other colors.

9. The color image forming apparatus according to claim 8, wherein the following expression is satisfied:

$$L4<Lp, L5<Lp,$$

wherein L4 denotes a distance between a developing position in which the development is performed onto the photosensitive member by the developing unit and a transfer position in which the transfer is performed onto the printing medium by the transfer means, L5 denotes a distance between the transfer position and a fixing position in which the fixation is performed to the printing medium by the fixing means, and Lp denotes a length of the printing medium in a conveying direction.

10. The color image forming apparatus according to claim 8, wherein the number of developing units is four, colors of the toner included in the four developing units are yellow, magenta, cyan and black, respectively, and the last color in the development onto the photosensitive member by the developing is yellow or black.

11. A color image forming unit, comprising:

a photosensitive member on the surface of which an electrostatic latent image can be formed, a plurality of developing units each having a different color of toner and developing means, a developing unit moving means for switching the plurality of developing units by moving them selectively between an image forming position and other positions, a transfer means for forming one sheet of color image on a transfer member by bringing the transfer member into contact with the photosensitive member, by sequentially transferring a toner image formed on the photosensitive member, and by overlapping the toner images of each color, in accordance with the switching of the developing units positioned at the image forming position, a transfer member driving means for driving the transfer member, and at least one of the plurality of developing units having a black toner;

wherein a high speed mode for outputting a plurality of color image can be performed, wherein when a first sheet of color image is formed, a black toner image is finally overlapped to form one sheet of color image; when a second sheet of color image is formed following the formation of the first sheet of color image, the developing unit moving means is not operated and the image formation continues with the developing unit for black remaining at the image forming position, thus forming one sheet of color image by first transferring the black toner image onto the transfer member; and when a third sheet of color image is formed following the formation of the second sheet of color image, one sheet of color image is formed in the same order of overlapping the toner images of many colors as that of the first sheet of color image.

12. The color image forming apparatus according to claim 11, wherein the transfer member is an intermediate transfer member for re-transferring one sheet of color image formed by the toner images of many colors onto the recording paper together.

13. The color image forming apparatus according to claim 11, wherein each of the plurality of developing units is formed integrally as one unit including the photosensitive member.

14. The color image forming apparatus according to claim 11, wherein a normal mode for outputting a plurality of color image can be performed, wherein when a first sheet of color image is formed, a black toner image is finally overlapped to form one sheet of color image; and when a second sheet of color image is formed following the formation of the first sheet of color image, one sheet of color image is formed in the same order of overlapping the toner images of many colors as that of the first sheet of color image by switching the developing units.

15. The color image forming apparatus according to claim 11, further comprising four-color mode for forming the color image by using four colors of yellow, magenta, cyan and black; and three-color mode for forming the color image by using three colors of yellow, magenta and cyan.

16. The color image forming apparatus according to claim 11, wherein the developing unit for black is positioned at the image forming position during a standing state in which the printing is not performed.

17. The color image forming apparatus according to claim 11, wherein when the developing units are switched by operating the developing unit moving means for forming the third color image after the second color image is formed, the developing unit for the first color on which the first color image is formed is moved to the image forming position without stopping the developing unit moving means midway.

* * * * *